United States Patent
Fukiage et al.

(10) Patent No.: US 11,201,053 B2
(45) Date of Patent: Dec. 14, 2021

(54) FILM FORMING METHOD AND FILM FORMING APPARATUS

(71) Applicant: TOKYO ELECTRON LIMITED, Tokyo (JP)

(72) Inventors: Noriaki Fukiage, Nirasaki (JP); Takayuki Karakawa, Nirasaki (JP); Toyohiro Kamada, Nirasaki (JP); Akihiro Kuribayashi, Nirasaki (JP); Takeshi Oyama, Nirasaki (JP); Jun Ogawa, Nirasaki (JP); Kentaro Oshimo, Nirasaki (JP); Shimon Otsuki, Nirasaki (JP); Hideomi Hane, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/890,216

(22) Filed: Jun. 2, 2020

(65) Prior Publication Data
US 2020/0294787 A1    Sep. 17, 2020

Related U.S. Application Data

(62) Division of application No. 15/459,441, filed on Mar. 15, 2017, now Pat. No. 10,714,332.

(30) Foreign Application Priority Data

Mar. 17, 2016 (JP) .................................. 2016-054072
Oct. 24, 2016 (JP) .................................. 2016-207980

(51) Int. Cl.
*H01L 21/02*    (2006.01)
*C23C 16/455*    (2006.01)
(Continued)

(52) U.S. Cl.
CPC ...... *H01L 21/0217* (2013.01); *C23C 16/0272* (2013.01); *C23C 16/045* (2013.01);
(Continued)

(58) Field of Classification Search
CPC ............. H01L 21/0217; H01L 21/0228; H01L 21/0234
See application file for complete search history.

(56) References Cited

U.S. PATENT DOCUMENTS 5,670,431 A     9/1997  Huanga et al.
2001/0054749 A1  12/2001  Kirchoff
(Continued)

FOREIGN PATENT DOCUMENTS

JP    2012-146955 A    8/2012
JP    2013-082986 A    5/2013
(Continued)

*Primary Examiner* — Wasiul Haider
(74) *Attorney, Agent, or Firm* — Nath, Goldberg & Meyer; Jerald L. Meyer; Tanya E. Harkins

(57) ABSTRACT

A method for forming a silicon nitride film to cover a stepped portion formed by exposed surfaces of first and second base films in a substrate, includes: forming a nitride film or a seed layer to cover the stepped portion, wherein the nitride film is formed by supplying, to the substrate, a nitrogen-containing base-film nitriding gas for nitriding the base films, exposing the substrate to plasma and nitriding the surface of the stepped portion, and the seed layer is composed of a silicon-containing film formed by supplying a raw material gas of silicon to the substrate and is configured such that the silicon nitride film uniformly grows on the surfaces of the base films; and forming the silicon nitride film on the seed layer by supplying, to the substrate, a second raw material gas of silicon and a silicon-nitriding gas for nitriding silicon.

3 Claims, 27 Drawing Sheets

(51) Int. Cl.
*C23C 16/02* (2006.01)
*C23C 16/04* (2006.01)
*C23C 16/34* (2006.01)

(52) U.S. Cl.
CPC ...... *C23C 16/345* (2013.01); *C23C 16/45551* (2013.01); *H01L 21/0228* (2013.01); *H01L 21/02211* (2013.01); *H01L 21/02247* (2013.01); *H01L 21/02252* (2013.01); *H01L 21/02274* (2013.01); *H01L 21/02304* (2013.01)

(56) References Cited

U.S. PATENT DOCUMENTS

| | | | |
|---|---|---|---|
| 2011/0217834 A1 | 9/2011 | Ganguly et al. | |
| 2012/0187523 A1* | 7/2012 | Cummings | H01L 21/823878 257/506 |
| 2014/0099734 A1* | 4/2014 | Saito | C23C 16/56 438/3 |
| 2014/0295676 A1* | 10/2014 | Suzuki | H01L 21/0228 438/776 |
| 2017/0194424 A1* | 7/2017 | Huang | H01L 21/02532 |

FOREIGN PATENT DOCUMENTS

| | | |
|---|---|---|
| JP | 2016-018907 A | 2/2016 |
| KR | 10-2012-0070516 A | 6/2012 |
| KR | 10-2016-0006631 A | 1/2016 |
| WO | 2013137115 A1 | 9/2013 |

\* cited by examiner

Evaluation test 2-1

Evaluation test 2-2

Evaluation test 2-3

Evaluation test 2-4

Evaluation test 2-5

Evaluation test 2-6

FILM FORMING METHOD AND FILM FORMING APPARATUS

CROSS-REFERENCE TO RELATED APPLICATIONS

This is a Divisional Application of U.S. patent application No.: 15/459,441, filed Mar. 15, 2017, an application claiming benefit from Japanese Patent Application Nos. 2016-054072 and 2016-207980, filed on Mar. 17, 2016 and Oct. 24, 2016,respectively, in the Japan Patent Office, the disclosure of each of which is incorporated herein in their entirety by reference.

TECHNICAL FIELD

The present disclosure relates to a film forming method and apparatus for forming a silicon nitride film on a substrate.

BACKGROUND

In a semiconductor manufacturing process, a film forming process is carried out to form a SiN (silicon nitride) film on a substrate so as to cover a base film having a stepped portion formed by a hole, recess or the like in the substrate. The SiN film is required to be formed at a uniform film thickness throughout respective portions of the substrate. A film forming apparatus for forming a SiN film on a base film by Atomic Layer Deposition (ALD) is known in the art.

In a film forming process using such an ALD, a film forming gas is supplied to a surface of a substrate to form a thin layer which covers the whole surface of the substrate. The thin layer starts to grow to form a film. A time from when the film forming gas is supplied till when the thin layer is formed (namely, when the film starts to be formed) is called an incubation time. This incubation time depends on the type of a base film constituting the surface of the substrate on which a film is formed.

There may be a case where a stepped portion is formed by multiple types of base films stacked one above another, and these base films are exposed as a surface of a substrate. A method of forming a SiN film on the substrate having the base films thus formed is under consideration. However, there is a difference in incubation time between the base films as described above. This makes it difficult to enhance a film thickness uniformity of the SiN film in-plane of the substrate.

SUMMARY

Some embodiments of the present disclosure provide a technology capable of suppressing a film thickness of an in-plane silicon nitride film of a substrate from being varied, when forming the silicon nitride film on the substrate whose stepped portion is formed by exposed surfaces of different types of first and second base films stacked one above another According to one embodiment of the present disclosure, there is provided a film forming method for forming a silicon nitride film to cover a stepped portion formed in a substrate, the stepped portion being formed by exposed surfaces of different types of first and second base films which are stacked one above another, the method including: forming a nitride film or a seed layer to cover the stepped portion, wherein the nitride film is formed by supplying, to the substrate, a base-film nitriding gas containing nitrogen for nitriding the first and second base films, exposing the substrate to plasma and nitriding the surface of the stepped portion, and the seed layer is composed of a silicon-containing film formed by supplying a raw material gas of silicon to the substrate and is configured such that the silicon nitride film uniformly grows on the surface of the first base film and on the surface of the second base film; and subsequently, forming the silicon nitride film on the seed layer by supplying, to the substrate, a second raw material gas of silicon and a silicon-nitriding gas for nitriding silicon.

According to another embodiment of the present disclosure, there is provided a film forming apparatus for forming a silicon nitride film to cover a stepped portion formed in a substrate, the stepped portion being formed by exposed surfaces of different types of first and second base films which are stacked one above another, the apparatus including: a seed layer forming part including a base-film nitriding gas supply part and a plasma generation part or a silicon raw material gas supply part, wherein the base-film nitriding gas supply part is configured to supply a base-film nitriding gas containing nitrogen for nitriding the first and second base films to the substrate, the plasma generation part is configured to generate plasma on a surface of the substrate such that a nitride film is formed by nitriding a surface of the stepped portion using the base-film nitriding gas, and the silicon raw material gas supply part is configured to form a silicon-containing film by supplying a raw material gas of silicon to the substrate; a silicon nitride film forming part configured by the silicon raw material gas supply part and a silicon-nitriding gas supply part configured to supply a silicon nitriding gas for nitriding silicon to the substrate; and a control part configured to output a control signal so as to perform forming a seed layer composed of the nitride film or the silicon-containing film to cover the stepped portion such that the silicon nitride film uniformly grows on the surface of the first base film and the surface of the second base film, and subsequently, forming the silicon nitride film by supplying the raw material gas of silicon and the silicon-nitriding gas to the substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

A film forming apparatus 1 according to a first embodiment of the present disclosure will be described with reference to a longitudinal sectional view of FIG. 1 and a cross sectional view of FIG. 2. The film forming apparatus 1 forms a SiN film on a surface of a semiconductor wafer B (hereinafter, referred to as a "wafer") as a substrate by Atomic Layer Deposition (ALD). The SiN film is used as, for example, a gate of a transistor, or a pattern mask for etching a underlying film of the SiN film to embed a wiring in the underlying film.

In the present specification, silicon nitride will be described as SiN irrespective of a stoichiometric ratio of Si and N. Accordingly, the term "SiN" as used herein includes, for example, $Si_3N_4$. Furthermore, silicon oxide will be described as SiO irrespective of a stoichiometric ratio of Si and O. Accordingly, the term "SiO" as used herein includes, for example, $SiO_2$. In addition, the film forming apparatus 1 forms a seed layer for making a film thickness of the SiN film uniform by nitriding the surface of the wafer B before forming the respective SiN film and by arranging timings of starting to form the respective SiN film in-plane of the wafer B.

Figure 1:
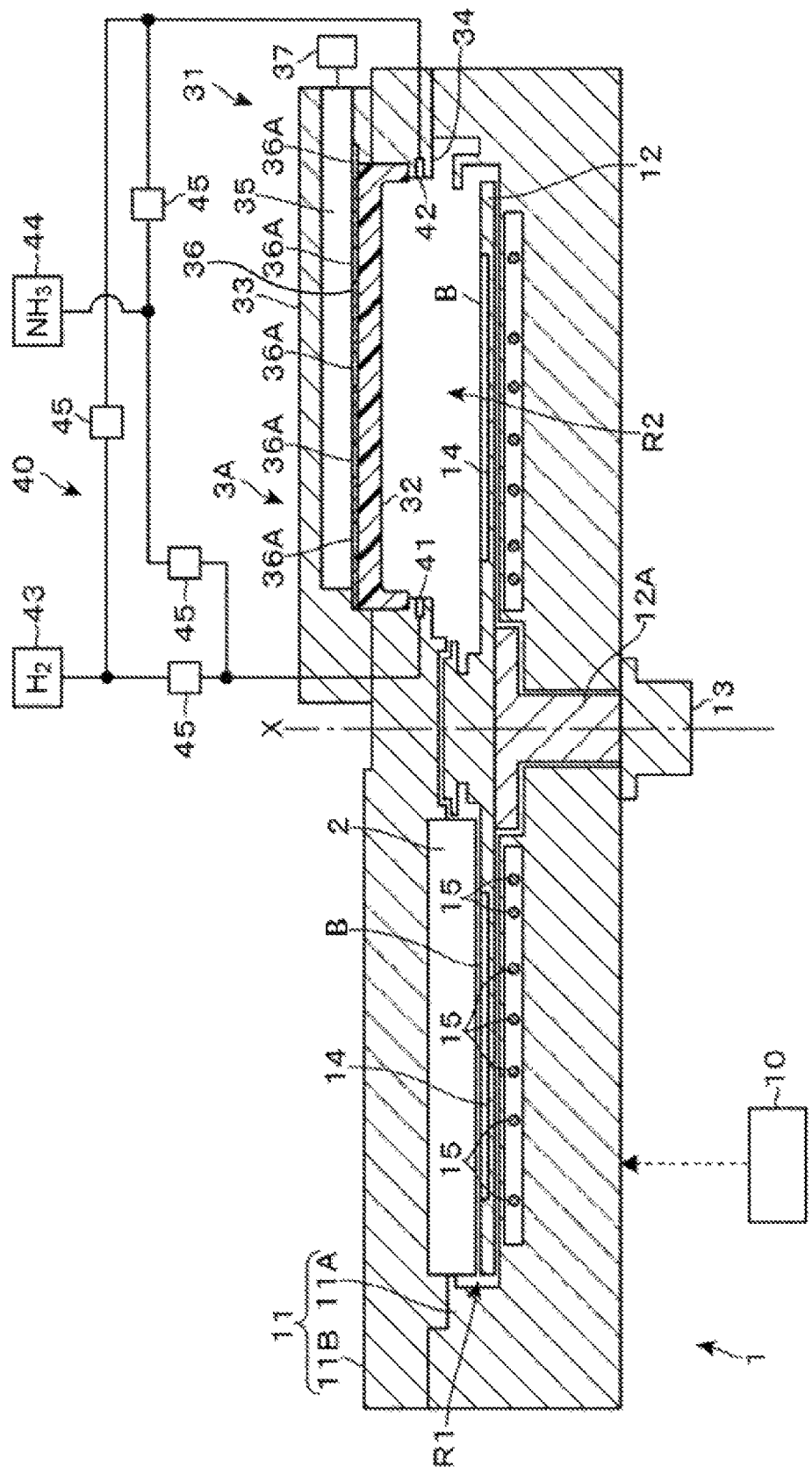
FIG. 1 is a schematic longitudinal sectional view of a film forming apparatus according to a first embodiment of the present disclosure.

In FIG. 1, reference numeral 11 denotes a substantially flat circular vacuum container (process container), which includes a container main body 11A constituting a sidewall and a bottom portion, and a ceiling plate 11B. In FIG. 1, reference numeral 12 denotes a circular rotary table horizontally installed within the vacuum container 11. In FIG. 1, reference numeral 12A denotes a support part that supports the central portion of the back side of the rotary table 12. In FIG. 1, reference numeral 13 denotes a rotary drive mechanism that circumferentially rotates the rotary table 12 (in a clockwise direction when viewed from the top) through the support part 12A during a film forming process. In FIG. 1, X denotes a rotation axis of the rotary table 12.

The rotary table 12 has six circular concave portions 14 formed on the upper surface thereof along the circumferential direction (rotational direction). The wafers B are received in the respective concave portions 14. Specifically, the wafers B are mounted on the rotary table 12 such that they revolve with the rotation of the rotary table 12. In FIG. 1, reference numeral 15 denotes a plurality of heaters concentrically installed in the bottom portion of the vacuum container 11 so as to heat the wafers B mounted on the rotary table 12. In FIG. 2, reference numeral 16 denotes a transfer port formed in the sidewall of the vacuum container 11 and through which the wafers B are transferred. The transfer port is configured to be opened and closed by a gate valve (not shown). The wafers B are transferred between the outside of the vacuum container 11 and the concave portions 14 through the transfer port 16 by a substrate transfer mechanism (not shown).

A gas supply/exhaust unit 2, a plasma generation unit 3A, a plasma generation unit 3B, and a plasma generation unit 3C are sequentially installed above the rotary table 12 toward an upstream side of the rotational direction of the rotary table 12 along the respective rotational direction. These units 2 and 3A to 3C constitute a seed layer forming part and a silicon nitride film forming part.

Hereinafter, the gas supply/exhaust unit 2, which is a raw material gas supply part, will be described with reference to FIGS. 3 and 4, FIG. 3 being a longitudinal sectional view of the gas supply/exhaust unit 2, and FIG. 4 being a bottom view thereof. The gas supply/exhaust unit 2 has a fan-like plane shape gradually spreading outward from the central portion of the rotary table 12 to the outer peripheral portion thereof. A lower surface of the gas supply/exhaust unit 2 is arranged to approach the upper surface of the rotary table 12 while facing the rotary table 12.

The gas supply/exhaust unit 2 has a plurality of gas discharge holes 21, an exhaust opening 22, and a purge gas discharge opening 23 which are formed in the lower surface thereof. The plurality of gas discharge holes 21 is dispersedly arranged in a fan-like area 24 defined inward of the outer peripheral portion in the lower surface of the gas supply/exhaust unit 2. The gas discharge holes 21 are used to discharge a dichlorosilane (DCS) gas downward in a shower form to supply the same to the whole surface of each wafer B while the rotary table 12 is rotating in a film forming process. The dichlorosilane (DCS) gas is a raw material gas containing silicon (Si) for forming a SiN film. The raw material gas is not limited to the DCS gas. For example, a hexachlorodisilane (HCD) gas may be used as the raw material gas.

The fan-like area 24 is divided into three sub-areas 24A, 24B, and 24C from the central portion of the rotary table 12 to the outer peripheral portion thereof. The gas supply/exhaust unit 2 includes gas passages 25A, 25B, and 25C formed independently therein such that the DCS gas is supplied to the gas discharge holes 21 arranged in the sub-area 24A, the gas discharge holes 21 arranged in the sub-area 24B, and the gas discharge holes 21 arranged in the sub-area 24C, independently of each other. Downstream ends of the gas passages 25A, 25B, and 25C are configured as the gas discharge holes 21.

Upstream sides of the gas passages 25A, 25B, and 25C are connected to a DCS gas supply source 26 through respective pipes. A gas supply kit 27 configured with a valve and a mass flow controller is installed in each of the pipes. The gas supply kits 27 control the supply and cutoff of the DCS gas from the DCS gas supply source 26 to the gas passages 25A, 25B, and 25C, and a flow rate of the DCS gas. Gas supply kits to be described below, other than the gas supply kits 27, are also configured similar to the gas supply kits 27 to control the supply and cutoff of gases to be flown toward respective downstream sides and flow rates of the gases.

Next, the exhaust opening 22 and the purge gas discharge opening 23 will be described. For the sake of identification, the exhaust opening 22 and the purge gas discharge opening 23 are indicated by multiple dots in FIG. 4. The exhaust opening 22 and the purge gas discharge opening 23 are formed to surround the fan-like area 24 and are opened to face the upper surface of the rotary table 12 in an annular form in the outer peripheral portion of the lower surface of the gas supply/exhaust unit 2. The purge gas discharge opening 23 is located outside the exhaust opening 22. A region inward of the exhaust opening 22 above the rotary table 12 is defined as a raw material gas adsorption region R1 in which the DCS gas is adsorbed onto the surface of the wafer B. The purge gas discharge opening 23 is used to discharge an argon (Ar) gas as a purge gas onto the rotary table 12.

During the film forming process, the discharge of the raw material gas from the gas discharge holes 21, the exhaust of gas through the exhaust opening 22, and the discharge of the purge gas from the purge gas discharge opening 23 are simultaneously carried out. Accordingly, as shown by arrows in FIG. 3, the raw material gas and the purge gas discharged toward the rotary table 12 are directed toward the exhaust opening 22 along the upper surface of the rotary table 12 and exhausted through the exhaust opening 22. By discharging and exhausting the purge gas in this way, atmosphere of the raw material gas adsorption region R1 is separated from an external atmosphere so that the raw material gas can be restrictively supplied to the respective raw material gas adsorption region RE Specifically, this configuration suppresses the DCS gas supplied to the raw material gas adsorption region R1 from being mixed with gases and active species thereof supplied outward of the raw material gas adsorption region R1 by the plasma generation units 3A to 3C (to be described later). It is therefore possible to form a film on the wafer B by ALD, as will be described below. Furthermore, the purge gas also serves to remove the DCS gas excessively adsorbed onto the wafer B from the respective wafer B, in addition to separating the atmosphere of the raw material gas adsorption region R1 from the external atmosphere.

Figure 3:
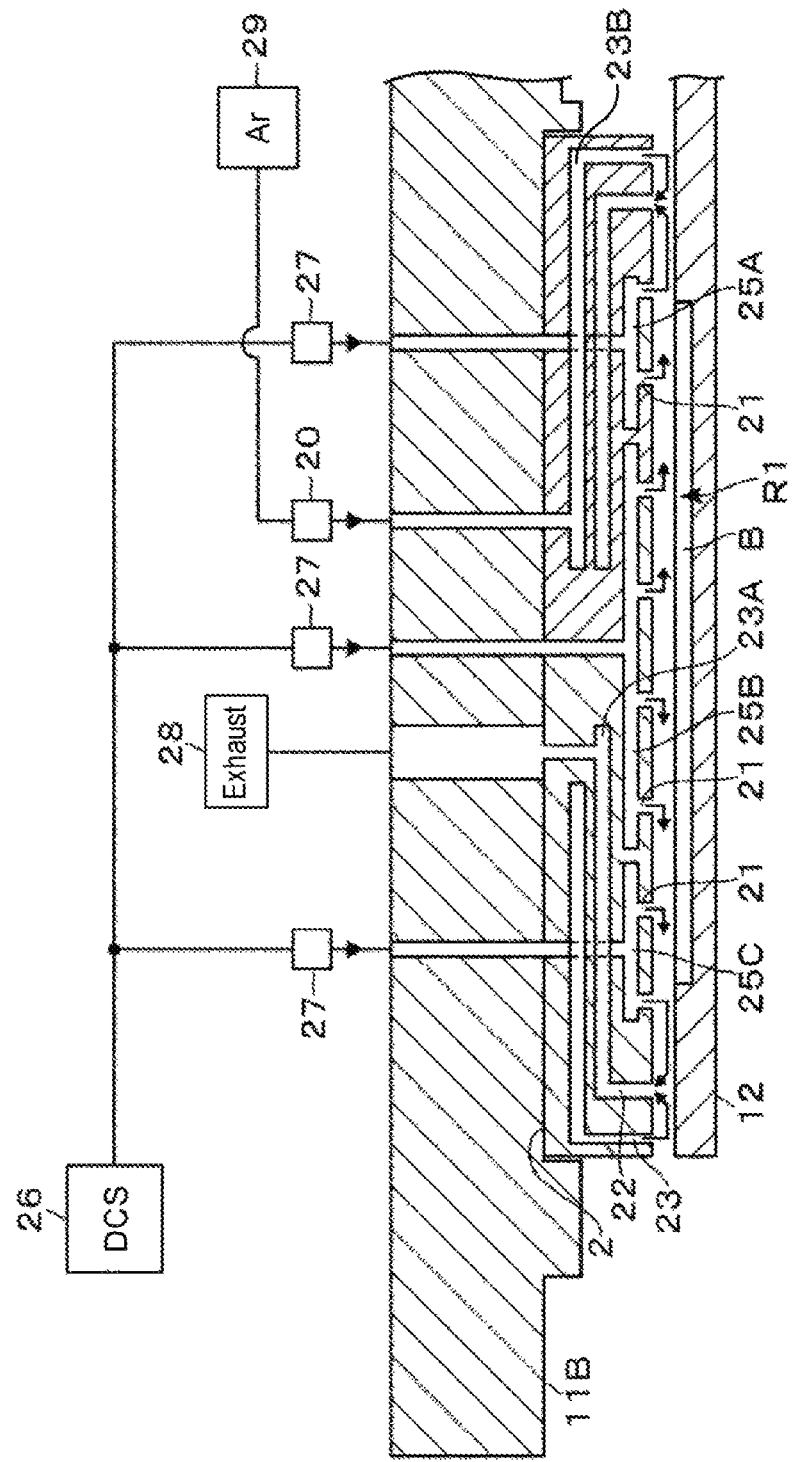
FIG. 3 is a longitudinal sectional view of a gas supply/exhaust unit installed in the film forming apparatus.
Figure 4:
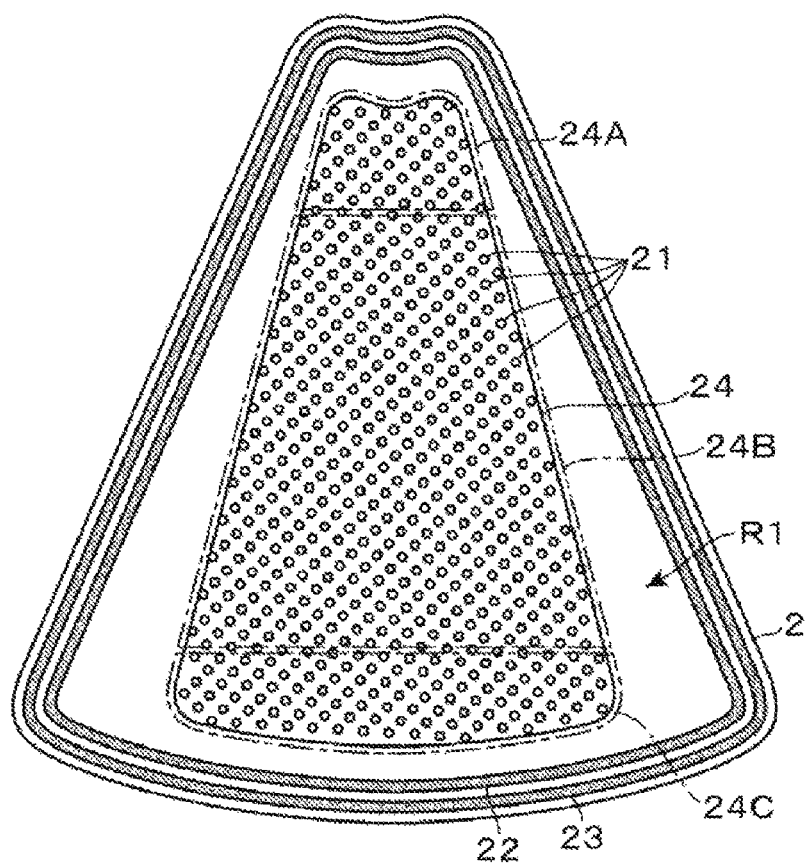
FIG. 4 is a bottom view of the gas supply/exhaust unit.

In FIG. 3, reference numerals 23A and 23B denote gas passages formed in the gas supply/exhaust unit 2 so as to be separated from each other. The gas passages 23A and 23B are also formed to be separated from the raw material gas passages 25A to 25C. An upstream end of the gas passage 23A is connected to the exhaust opening 22. A downstream end of the gas passage 23A is connected to an exhaust device 28. A gas can be exhausted through the exhaust opening 22 by the exhaust device 28. A downstream end of the gas passage 23B is connected to the purge gas discharge opening 23 and an upstream end thereof is connected to an argon (Ar) gas supply source 29. A gas supply kit 20 is installed in a pipe connecting the gas passage 23B and the Ar gas supply source 29.

Next, the plasma generation units 3A to 3C as a plasma generation part will be described. The plasma generation units 3A to 3C have the same configuration. The plasma generation unit 3A illustrated in FIG. 1 will be used to describe the plasma generation part. The plasma generation unit 3A supplies a plasma-generating gas onto the rotary table 12 and supplies microwaves to the plasma-generating gas, thus generating plasma on the rotary table 12. The plasma generation unit 3A includes an antenna 31 for supplying the microwaves. The antenna 31 includes a dielectric plate 32 and a metal waveguide 33.

The dielectric plate 32 is formed in a fan-like planar shape which gradually spreads from the central portion of the rotary table 12 to the outer peripheral portion thereof. A substantially fan-like through-hole is formed in the ceiling plate 11B of the vacuum container 11 to correspond to the shape of the dielectric plate 32. A lower inner circumferential surface of the through-hole slightly protrudes toward the central portion of the through-hole to form a support portion 34. The dielectric plate 32 is inserted into the through-hole from above so as to close the through-hole while facing the rotary table 12. A peripheral portion of the dielectric plate 32 is supported by the support portion 34.

The waveguide 33 is installed above the dielectric plate 32 and has an internal space 35 extending along the diameter direction of the rotary table 12. In FIG. 1, reference numeral 36 denotes a slot plate constituting a lower side of the waveguide 33. The slot plate 36 is installed in contact with the dielectric plate 32 and has a plurality of slot holes 36A formed therein. An end portion of the waveguide 33 in a side of the central portion of the rotary table 12 is closed, and the other portion of the waveguide 33 in a side of the peripheral portion of the rotary table 12 is connected to a microwave generator 37. The microwave generator 37 supplies microwaves of, for example, about 2.45 GHz to the waveguide 33.

Furthermore, the plasma generation unit 3A has first and second gas discharge holes 41 and 42 formed below the dielectric plate 32 to supply the plasma-generating gas. These gas discharge holes 41 and 42 as a plasma-generating gas supply part are formed at multiple positions in the support portion 34 of the dielectric plate 32 along, for example, the circumferential direction of the vacuum container 11. The first gas discharge holes 41 is formed to discharge the plasma-generating gas from the central portion side of the rotary table 12 toward the peripheral portion side thereof, and the second gas discharge holes 42 is formed to discharge the plasma-generating gas from the peripheral portion side of the rotary table 12 to the central portion side thereof.

The microwaves supplied to the waveguide 33 reach the dielectric plate 32 through the slot holes 36A of the slot plate 36 and subsequently, are directed to the plasma-generating gas, which has been discharged downward from the dielectric plate 32, so that plasma is generated in a plasma generation region R2 defined below the dielectric plate 32. Plasma generation regions of the plasma generation units 3B and 3C are indicated by symbols R3 and R4. Even in these plasma generation regions R3 and R4, plasma is generated as in the plasma generation region R2. As will be described below, gases supplied to the regions R2 to R4 include an NH₃ gas. Accordingly, the gas discharge holes 41 and 42 of the plasma generation units 3A to 3C constitute a nitriding gas supply part. Describing the plasma generation units 3A to 3C in more detail, these units do not carry out the supply and exhaust operations of the purge gas, which are performed in the gas supply/exhaust unit 2 described above. Thus, atmospheres in the plasma generation regions R2 to R4 are not separated from each other during the film forming process by the film forming apparatus 1.

For example, an H₂ (hydrogen) gas and an NH₃ (ammonia) gas are used as the plasma-generating gas. In FIG. 1, reference numeral 43 denotes an H₂ gas supply source, and reference numeral 44 denotes an NH₃ gas supply source. The first and second gas discharge holes 41 and 42 are coupled to the H₂ gas supply source 43 and the NH₃ gas supply source 44 through a pipe system 40 provided with gas supply kits 45. The pipe system 40 is configured to control the supply and cutoff of the H₂ gas from the H₂ gas supply source 43 to each of the gas discharge holes 41 and 42, and a flow rate of the H₂ gas. Further, the pipe system 40 is configured to control the supply and cutoff of the NH₃ gas from the NH₃ gas supply source 44 to each of the gas discharge holes 41 and 42, and a flow rate of the NH₃ gas.

Figure 2:
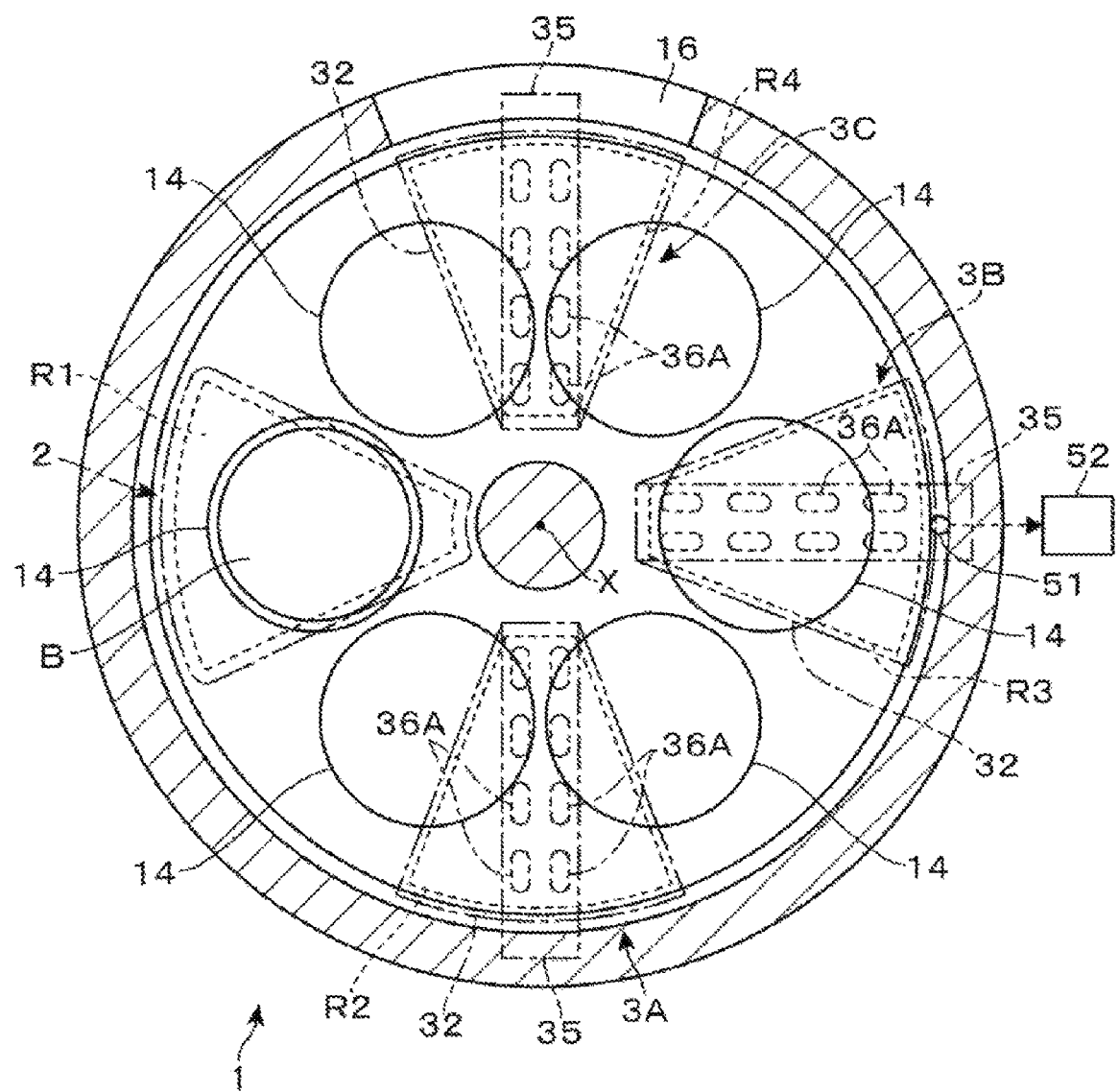
FIG. 2 is a transverse plan view of the film forming apparatus.

As illustrated in FIG. 2, an exhaust hole 51 is formed in the bottom portion of the vacuum container 11 outward of the rotary table 12. An exhaust device 52 is connected to the exhaust hole 51. An amount of gas to be exhausted through the exhaust hole 51 can be regulated by the exhaust device 52. A vacuum atmosphere having a pressure corresponding to the amount of exhaust gas is formed inside the vacuum container 11. The gases discharged from the plasma generation units 3A to 3C are exhausted and removed through the exhaust hole 51.

As illustrated in FIG. 1, the film forming apparatus 1 is provided with a control part 10 including a computer. The control part 10 has a program stored therein. The program includes steps (instructions) allowing the control part 10 to transmit control signals to respective parts of the film forming apparatus 1 to control the operations of the respective parts such that the film forming process to be described below is carried out. Specifically, the number of rotations of the rotary table 12 performed by the rotary drive mechanism 13, the flow rate and the supply/cutoff of each gas by each gas supply kit, the amount of gas exhausted by the exhaust devices 28 and 52, the supply/cutoff of microwaves from the microwave generator 37 to the antenna 31, the supply of power to the heaters 15, and the like are controlled by the program. Controlling the power supply to the heaters 15 corresponds to controlling the temperature of the wafer B, and controlling the amount of gas exhausted by the exhaust device 52 corresponds to controlling an internal pressure of the vacuum container 11. The program may be installed on the control part 10 from a storage medium such as a hard disc, a compact disc, an optical magnetic disc, a memory card, or the like.

Figure 5:
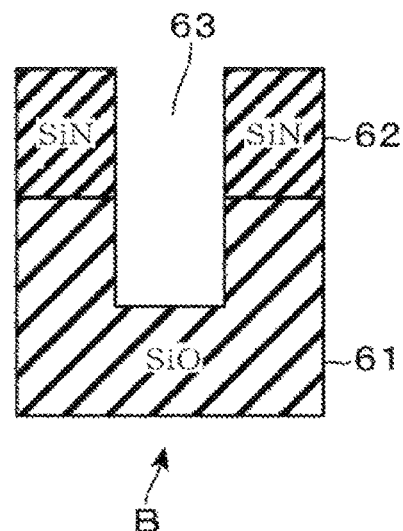
FIG. 5 is a longitudinal sectional view of a surface of a wafer which has not been processed by the film forming apparatus.
Figure 6:
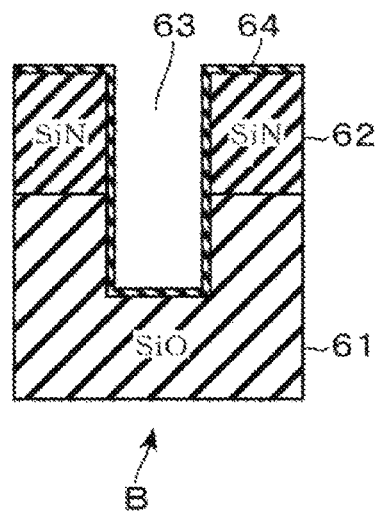
FIGS. 6 to 8 are longitudinal sectional views of the surface of the wafer which is being processed by the film forming apparatus.
Figure 7:
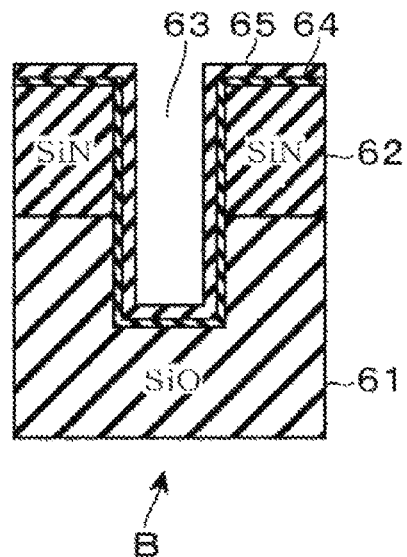
Figure 8:
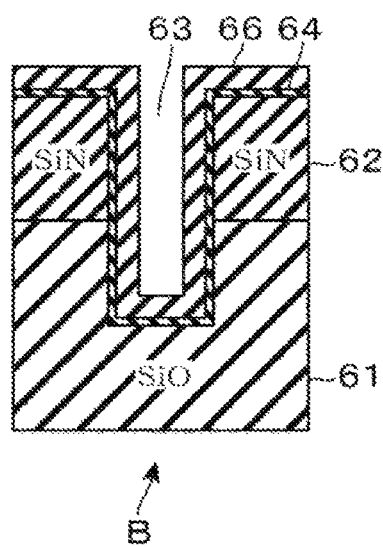

FIG. 5 is a longitudinal sectional view of a surface of a wafer B which has not been processed by the film forming apparatus 1, and FIGS. 6 to 8 are longitudinal sectional views of the surface of the wafer B which is being processed by the film forming apparatus 1. First, the wafer B illustrated in FIG. 5 will be described. A SiO film 61 and a SiN film 62, which serve as base films of a SiN film to be formed by the film forming apparatus 1, are sequentially stacked one above another. A film quality of the SiN film to be formed by the film forming apparatus 1 is different from that of the SiN film 62. A recess 63 is formed in the surface of the wafer B such that a bottom surface of the recess 63 is lower than a lower end of the SiN film 62. Accordingly, surfaces of the sidewalls of the recess 63 constituting a stepped portion are constituted by the SiO film 61 and the SiN film 62, and the bottom surface of the recess 63 is constituted by the SiO film 61. Specifically, the SiO film 61 and the SiN film 62 are exposed as the surface of the wafer B.

Figure 9:
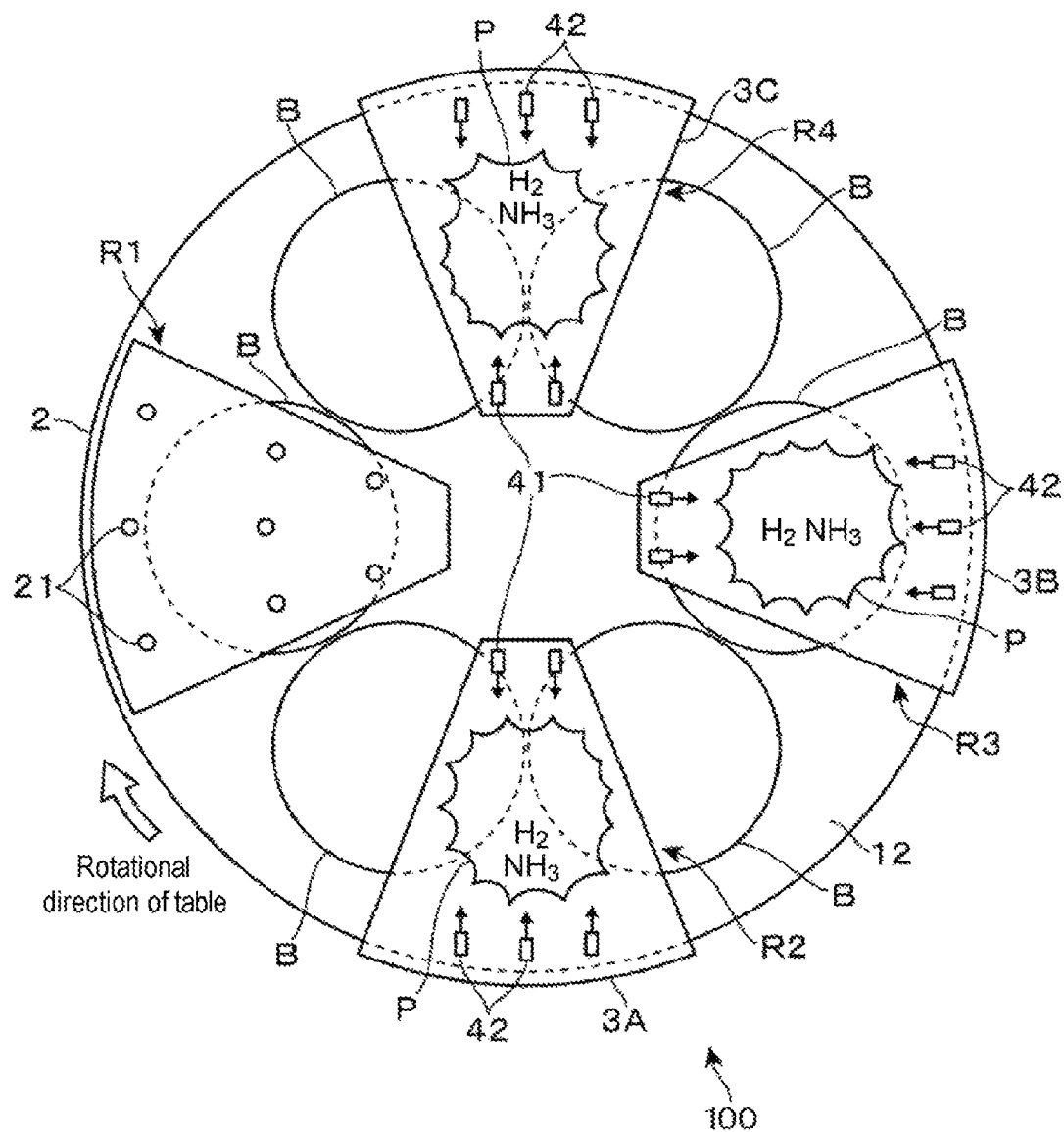
FIG. 9 is a schematic view illustrating a state of the film forming apparatus.
Figure 10:
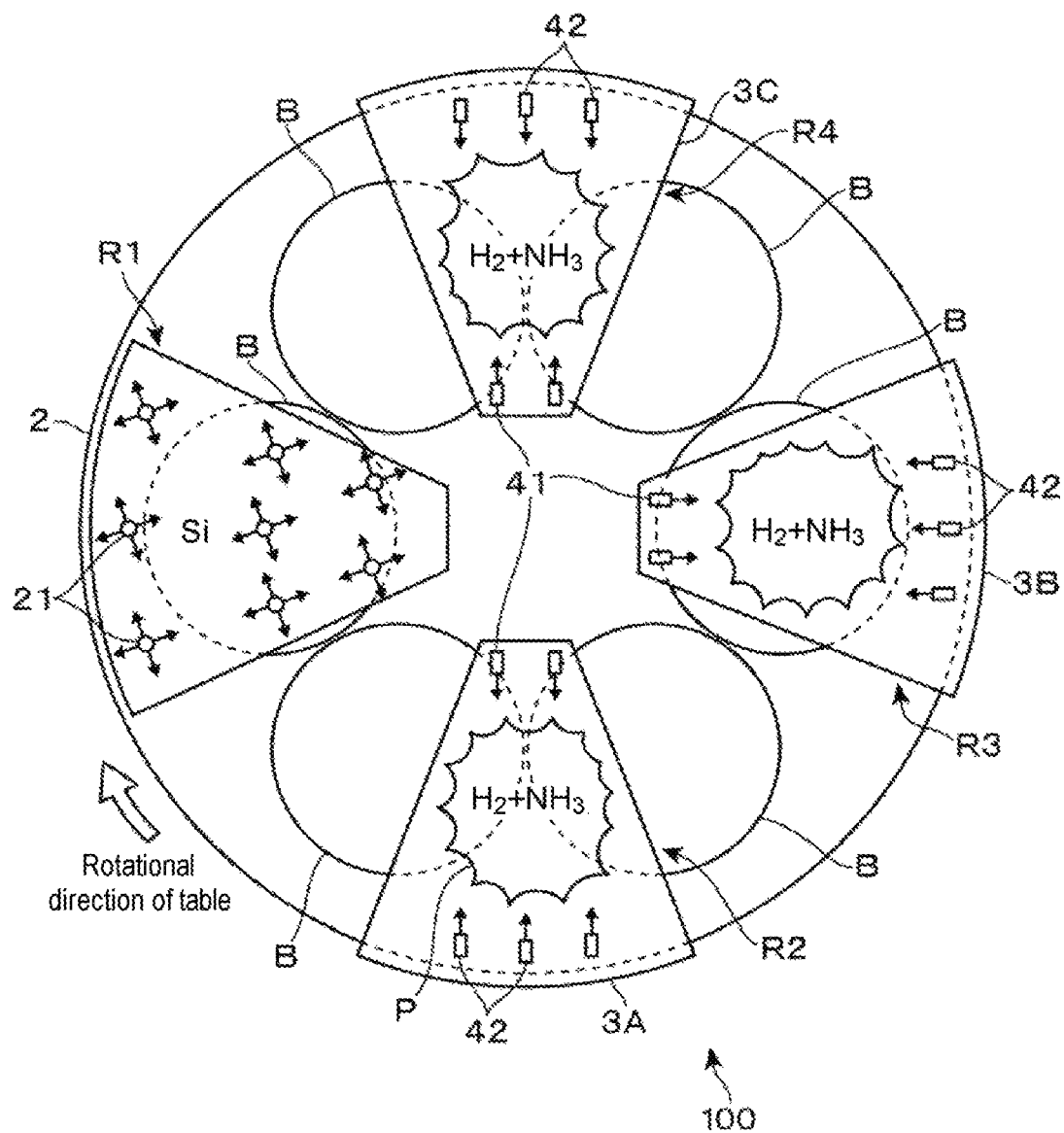
FIG. 10 is a schematic view illustrating a state of the film forming apparatus.

Hereinafter, processes performed by the film forming apparatus 1 will be described with reference to FIGS. 6 to 8 and FIGS. 9 and 10. FIG. 9 schematically illustrates a state where gases are supplied from respective parts of the vacuum container 11 and FIG. 10 schematically illustrates a state where plasma is generated. In FIGS. 9 and 10, the discharge of the gases from the respective parts is indicated by arrows. First, six sheets of the wafers B described with reference to FIG. 5 are transferred to the respective concave portions 14 of the rotary table 12 through the transfer port 16 by the substrate transfer mechanism. The transfer port 16 is closed by the gate valve installed in the transfer port 16 so that the vacuum container 11 is hermetically sealed. Subsequently, the wafers B mounted in the concave portions 14 are heated to a predetermined temperature by the heaters 15. The interior of the vacuum container 11 is exhausted through the exhaust hole 51 so that the interior of the vacuum container 11 is kept in a vacuum atmosphere of a predetermined pressure (for example, 66.5 Pa (0.5 Torr) to 665 Pa (5 Torr)). The rotary table 12 rotates at a speed of, for example, 10 rpm to 30 rpm.

In the plasma generation units 3A to 3C, a mixture of the H₂ gas and the NH₃ gas mixed at predetermined flow rates are discharged from each of the first and second gas discharge holes 41 and 42, and microwaves are supplied from the microwave generator 37. The H₂ gas and the NH₃ gas are plasmarized by the microwaves. Thus, as illustrated in FIG. 9, plasmas P are generated in the plasma generation regions R2 to R4, respectively. The wafers B pass through the plasma generation regions R2 to R4 with the rotation of the rotary table 12. At this time, active species constituting the plasma P, such as radicals containing nitrogen (N) generated from the NH₃ gas, are supplied to the surface of each wafer B. Thus, the SiO film 61 and the SiN film 62 exposed as the surface of the wafer B are nitrided to form a nitride film as a seed layer 64 (FIG. 6).

Once the seed layer 64 is formed to have a predetermined thickness on each wafer B through the nitridation, the formation of the seed layer 64 is ended. In the gas supply/exhaust unit 2, the DCS gas as a raw material gas and the Ar gas as a purge gas are discharged at predetermined flow rates through the gas discharge holes 21, and an exhaust operation is carried out through the exhaust opening 22. Furthermore, in the plasma generation regions R2 to R4, the plasma P is successively generated from the H₂ gas and the NH₃ gas.

While the gases are being supplied and the plasmas P are being generated as described above, the internal pressure of the vacuum container 11 reaches a predetermined pressure of, for example, 66.5 Pa (0.5 Torr) to 665 Pa (5 Torr). FIG. 10 illustrates a state in which the supply of gases accompanied by the generation of plasma P and the supply of gases not accompanied by the generation of the plasma P are conducted in the units 2 and 3A to 3C.

When the wafer B is located in the raw material gas adsorption region R1 with the rotation of the rotary table 12, the DCS gas as a silicon-containing raw material gas is supplied to the surface of the seed layer 64 and is adsorbed thereonto. As the rotary table 12 continues to rotate, the wafer B moves outward of the raw material gas adsorption region R1, and a purge gas is supplied to the surface of the wafer B to remove the residual DCS gas adsorbed onto the surface of the wafer B.

When the wafer B continues to move outward of the raw material gas adsorption region R1 to reach a series of the plasma generation regions R2 to R4, the active species of the $NH_3$ gas contained in the respective plasma are supplied to the wafer B to react with the DCS gas. Thus, a layer composed of SiN is formed on the seed layer 64 in an island shape.

Subsequently, with the continuous rotation of the rotary table 12, the wafer B moves from the plasma generation regions R2 to R4 toward the raw material gas adsorption region R1 again. Thereafter, similar to the above, the wafers B repeatedly pass through the raw material gas adsorption region R1 and the plasma generation regions R2 to R4 in that order such that the DCS gas and the active species of the $NH_3$ gas are continuously supplied to the respective wafers B. Thus, the SiN layer having such an island shape grows wider. The seed layer 64 is formed so that the surface of the SiO film 61 and the surface of the SiN film 62 have approximately the same property. Accordingly, the layer of SiN grows on the SiO film 61 and the SiN film 62 in the same way. As a result, a thin SiN layer 65 covering the entire SiO film 61 and the entire SiN film 62 is formed simultaneously or approximately simultaneously on the SiO film 61 and the SiN film 62 (FIG. 7). That is to say, incubation times of the SiO film 61 and the SiN film 62 are aligned with each other.

Thereafter, similar to the above, as the rotary table 12 continues to rotate, the SiN is deposited on the surface of the wafer B so that the thin SiN layer 65 grows as a SiN film 66. That is to say, the film thickness of the SiN film 66 is increased. Once the SiN film 66 is formed to have a desired film thickness, the gas supply/exhaust unit 2 stops the discharge and exhaust operations of the gases, the plasma generation unit 3A stops the supply of the gases and the microwaves, and the plasma generation units 3B and 3C stop the discharge operation of the gases. In this way, the film forming process is ended. The wafers B which have been subjected to the film forming process, are unloaded from the film forming apparatus 1 by the substrate transfer mechanism.

According to the film forming apparatus 1, the SiO film 61 and the SiN film 62 are stacked one above another such that exposed surfaces of the wafer B constitutes the recess 63. Surface layer portions of the SiO film 61 and the SiN film 62, which are exposed as the surface of the wafer B, are nitrided to form the seed layer 64. The SiN film 66 is formed on the seed layer 64 by ALD. The properties of the surfaces of the SiO film 61 and the SiN film 62 are matched with each other through the formation of the seed layer 64 so that the SiN film 66 grows on the SiO film 61 and the SiN film 62 in the same way. As a result, the film thickness of the SiN film 66 formed on the SiO film 61 and the SiN film 62 is uniform. That is to say, it is possible to form the SiN film 66 to have good film thickness uniformity throughout the entire in-plane area of the wafer B.

The internal pressure of the vacuum container 11 at the time of forming the seed layer 64 may be controlled to be lower than that at the time of forming the SiN film 66. This is to ensure that, at the time of forming the seed layer 64, the active species containing N are allowed to relatively freely move to enter the recess 63, ultimately reach the bottom of the recess 63, thus more surely forming the seed layer 64 within the recess 63, and at the time of forming the SiN film 66, the respective gases are prevented from diffusing on the rotary table 12 so as to enhance an increase in the film thickness of the SiN film 66 per unit time.

Second Embodiment

A seed layer is to match properties of different type of base films, as described above. The seed layer is not limited to a nitride film as long as it has such a function. For example, a molecular layer made of Si (silicon) may be formed as a seed layer on the surfaces of the SiO film 61 and the SiN film 62. The following description will be focused on a difference between the film forming apparatus 1 according to the first embodiment and a film forming apparatus 100 which forms a seed layer of Si according to a second embodiment.

Gas discharge holes 21 of a gas supply/exhaust unit 2 of the film forming apparatus 100 according to the second embodiment are coupled to, for example, a supply source of an organosilicon compound gas for forming a seed layer, such as diisopropyl aminosilane (DIPAS), bis-tertiary butyl aminosilane (BTBAS), Tris(dimethylamino)silane (3DMAS) or the like through a pipe system, in addition to the DCS gas supply source 26. This pipe system of the gas supply/exhaust unit 2 is configured such that the DCS gas and the organosilicon compound gas can be supplied at predetermined flow rates from the gas discharge holes 21 by gas supply kits 27 installed on the respective pipe system.

Figure 11:
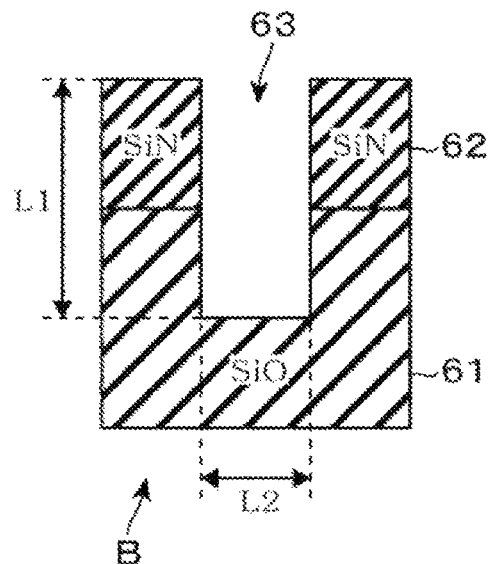
FIG. 11 is a longitudinal sectional view of a surface of a wafer which has not been processed by a film forming apparatus according to a second embodiment of the present disclosure.
Figure 12:
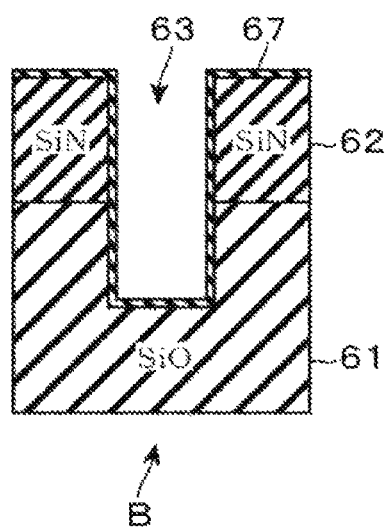
FIGS. 12 to 13 are longitudinal sectional views of the surface of the wafer which is being processed by the film forming apparatus.
Figure 13:
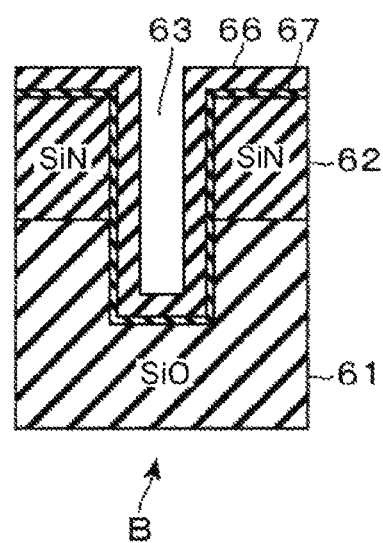
Figure 14:
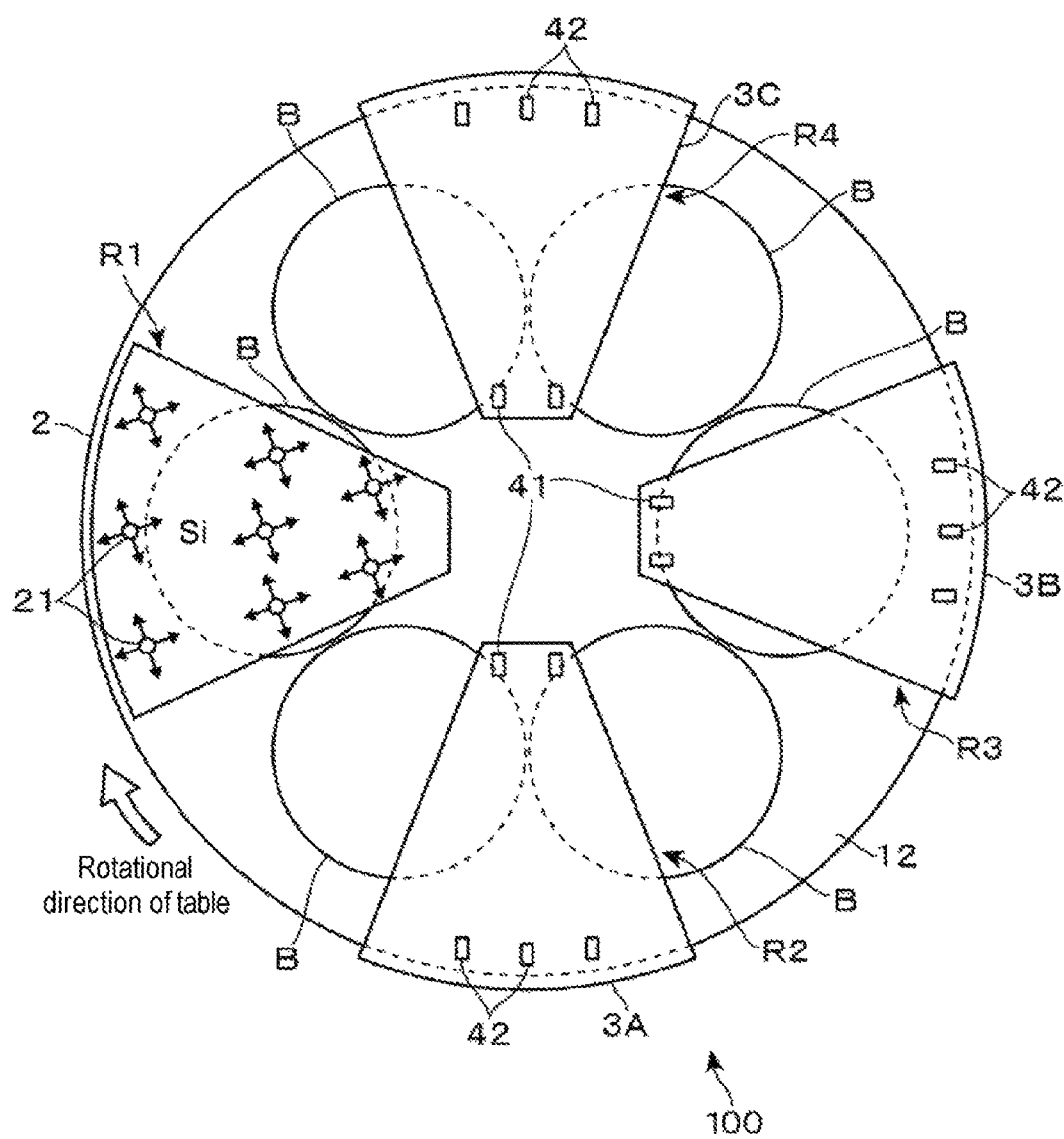
FIG. 14 is a schematic view illustrating a state of the film forming apparatus.

Hereinafter, a description of a process carried out by the film forming apparatus 100 according to the second embodiment will be given with reference to FIGS. 11 to 14, with a focus on differences between the process in the first embodiment and the process in the second embodiment. FIGS. 11 to 13 are longitudinal sectional views of the surface of a wafer B, and FIG. 14 is a schematic view of the film forming apparatus 100. FIG. 11 illustrates the wafer B which has not yet processed by the film forming apparatus 100. Likewise to the wafer B described with reference to FIG. 5, the wafer B illustrated in FIG. 11 includes a SiO film 61, a SiN film 62, and a recess 63. In FIG. 11, L1 and L2 denote a depth and width of the recess 63 in the wafer B. An aspect ratio of L1/L2 is, for example, 3 or more.

First, the wafer B illustrated in FIG. 11 is heated to a predetermined temperature already described, the interior of a vacuum container 11 is kept in a vacuum atmosphere of a predetermined pressure, and a rotary table 12 rotates, as in the process of forming the seed layer 64 in the first embodiment. In the gas supply/exhaust unit 2, the aforementioned organosilicon compound gas and an Ar gas as a purge gas are discharged at predetermined flow rates from the gas discharge holes 21, and an exhaust process is carried out through an exhaust opening 22. At this time, in plasma generation units 3A to 3C, for example, the supply of gases and the generation of plasma are not performed. FIG. 14 illustrates a state in which the supply of the gases is performed only in the gas supply/exhaust unit 2 as described above.

As the rotary table 12 rotates, the respective wafers B pass through the raw material gas adsorption region R1 where the organosilicon compound gas supplied thereto is adsorbed onto the surfaces of the SiO film 61 and the SiN film 62. Accordingly, a seed layer 67 as a silicon film is formed to cover the surfaces of the SiO film 61 and the SiN film 62, as illustrated in FIG. 12. Likewise to the DCS gas in the first embodiment, the organosilicon compound gas is restrictively supplied to the raw material gas adsorption region R1 by the supply and exhaust of the purge gas.

When the seed layer 67 is formed to have a predetermined thickness with the progress of the adsorption of the organosilicon compound gas, in the plasma generation units 3A to 3C, the supply of an $H_2$ gas and an $NH_3$ gas and the generation of plasma P based on the $H_2$ gas and the $NH_3$ gas are performed, while in the gas supply/exhaust unit 2, the supply of the DCS gas is performed instead of the organosilicon compound gas. That is to say, a process similar to the process of forming the SiN film 66 in the first embodiment, as described with reference to FIG. 10, is carried out to form a SiN film 66 on the seed layer 67 (FIG. 13). Since the seed layer 67 has been formed, incubation times of the SiN film 66 on the SiO film 61 and the SiN film 62 are matched with each other so that the SiN film 66 is formed and starts to grow simultaneously or nearly simultaneously, as in the first embodiment. Accordingly, the SiN film 66 is formed to have good film thickness uniformity throughout the entire in-plane area of the wafer B, as in the first embodiment.

In the first embodiment, the seed layer is formed by performing a nitriding process using the active species of N. However, in a case where the recess 63 has a relatively large aspect ratio, the active species of N have difficulty in entering the respective recess 63, which makes it difficult to form a seed layer in the lower portion side of the recess 63. In this respect, in a case where the recess 63 has an aspect ratio of, for example, 3 or more as described with reference to FIG. 11, it is preferable to perform the process of the second embodiment rather than that of the first embodiment. However, since the seed layer 64 is formed by a plasma process in the first embodiment, the first embodiment has an advantage in that foreign substances on the surfaces of the SiO film 61 and the SiN film 62 are removed from the respective films 61 and 62 by plasma, which makes it possible to enhance the quality of the seed layer. While the organosilicon compound gas is used to form the seed layer 67 in the second embodiment as already described, the DCS gas used to form the SiN film 66 may be used to form the seed layer 67, instead of the organosilicon compound gas. However, since the organosilicon compound gas has relatively high adsorption efficiency for the wafer B, the organosilicon compound gas may be used.

Modified Example of Second Embodiment

When forming the seed layer 67 in the second embodiment, in the plasma generation units 3A to 3C, plasma P may be generated in the plasma generation regions R2 to R4 by supplying an $NH_3$ gas and an $H_2$ gas together with microwaves, in parallel with the supply and exhaust operations of gases in the gas supply/exhaust unit 2. The organosilicon compounds adsorbed onto the wafer B are nitrided by the plasma P. That is to say, the seed layer 67 composed of the silicon film may be a nitrided layer. In this case, the seed layer 67 is a SiN film, and the SiN film 66 is stacked on the respective SiN film. However, the SiN film 66 is formed by, for example, ALD using physical adsorption (to be described later), which is different from the method of forming the seed layer 67. Thus, the SiN film 66 has a film quality different from that of the seed layer 67.

Third Embodiment

Next, a third embodiment will be described with a focus on the differences from the second embodiment. A film forming apparatus 200 of the third embodiment forms a SiO film as a seed layer. In the film forming apparatus 200 of the third embodiment, a pipe system 40 is configured such that gas discharge holes 41 and 42 of plasma generation units 3A to 3C are connected to an $O_3$ (ozone) gas supply source, in addition to the $H_2$ gas supply source 43 and the $NH_3$ gas supply source 44. Accordingly, the gas discharge holes 41 and 42 of the plasma generation units 3A to 3C are configured as an oxidation gas supply part. Further, the pipe system 40 is configured such that the $H_2$ gas, the $NH_3$ gas, and the $O_3$ gas are supplied at predetermined flow rates to the gas discharge holes 41 and 42 by gas supply kits 45.

Figure 15:
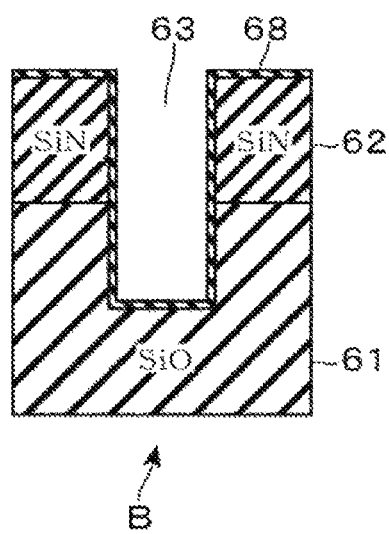
FIG. 15 is a longitudinal sectional view of the surface of a wafer which is being processed by a film forming apparatus according to a third embodiment of the present disclosure.
Figure 16:
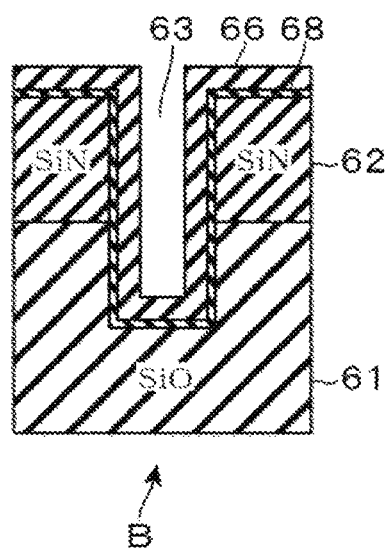
FIG. 16 is a longitudinal sectional view of the surface of the wafer.
Figure 17:
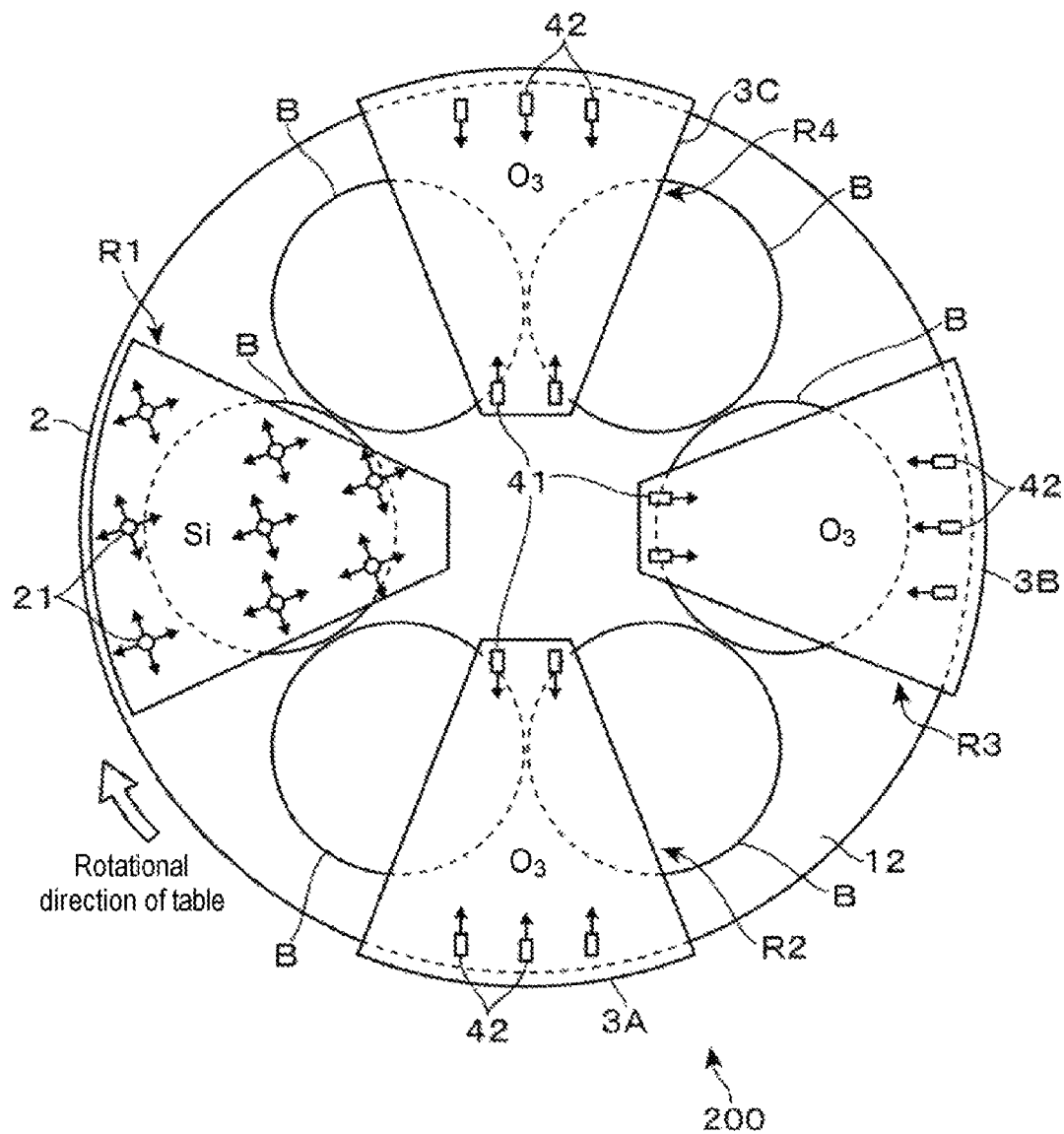
FIG. 17 is a schematic view illustrating a state of the film forming apparatus.

Next, a description of a process in the third embodiment will be given with reference to FIGS. 15 to 17, with a focus on the differences from the second embodiment. FIGS. 15 and 16 are longitudinal sectional views of the surface of a wafer B, and FIG. 17 is a schematic view of the film forming apparatus 200. For example, the wafer B described with reference to FIG. 12 is heated to the aforementioned temperature within the vacuum container 11, the internal pressure of the vacuum container 11 is kept in a vacuum atmosphere of a predetermined pressure, and the rotary table 12 rotates. As in the second embodiment, the gas supply/exhaust unit 2 supplies and exhausts each gas, while the plasma generation units 3A to 3C supply the $O_3$ gas. FIG. 17 illustrates a state in which the units 3A to 3C supply the $O_3$ gas as described above.

As the rotary table 12 rotates, each wafer B passes through the raw material gas adsorption region R1, and the organosilicon compound gas is adsorbed onto the surface of the wafer B, as described in the second embodiment. Thereafter, the wafer B passes through the regions R2 to R4. At this time, the organosilicon compounds adsorbed onto the wafer B are oxidized by the $O_3$ gas so that a seed layer 68, which is a SiO film, is formed to cover the surfaces of a SiO film 61 and a SiN film 62 (FIG. 15).

Thereafter, the SiN film 66 described with reference to FIG. 10 is formed as in the second embodiment. Since the seed layer 68 has been formed, the SiN film 66 grows on the SiO film 61 and the SiN film 62 in the same way as in the second embodiment. Accordingly, the SiN film 66 is formed to have good film thickness uniformity throughout the entire in-plane area of the wafer B, as in the first embodiment. Even in the third embodiment, nitrogen-based plasma is not used in forming the seed layer 68. Thus, as in the second embodiment, the third embodiment may be applied to the wafer B in which the recess 63 described with reference to FIG. 12 has an aspect ratio of 3 or more.

After the seed layer 68 is formed in the third embodiment, the plasma generation units 3A to 3C may supply microwaves while supplying an $NH_3$ gas and an $H_2$ gas such that plasmas P are generated in plasma generation regions R2 to R4 and the seed layer 68 is nitrided, as described in the modified example of the second embodiment. That is to say, the seed layer may be a nitrided SiO film.

However, the present disclosure is not limited to being applied to the wafer B having the structure described with reference to FIG. 5 or 11. Specifically, the present disclosure is not limited to a wafer B having a recess as a stepped portion formed therein, but may be applied to a wafer B having a convex portion as a stepped portion formed therein. Furthermore, the present disclosure may also be applied to a case where the SiN film 66 is formed on a base film made of a material other than SiO and SiN. For example, in FIG. 18, an example in which a carbon (C) film 72 is stacked on a Si film 71 is shown. The carbon film 72 is installed on the Si film 71 to protrude from the flat surface of the Si film 71, thus forming a convex portion. Accordingly, upper and side surfaces of the carbon film 72, and an area that does not overlap the carbon film 72 in the Si film 71 are exposed as the surface of the wafer B.

Figure 18:
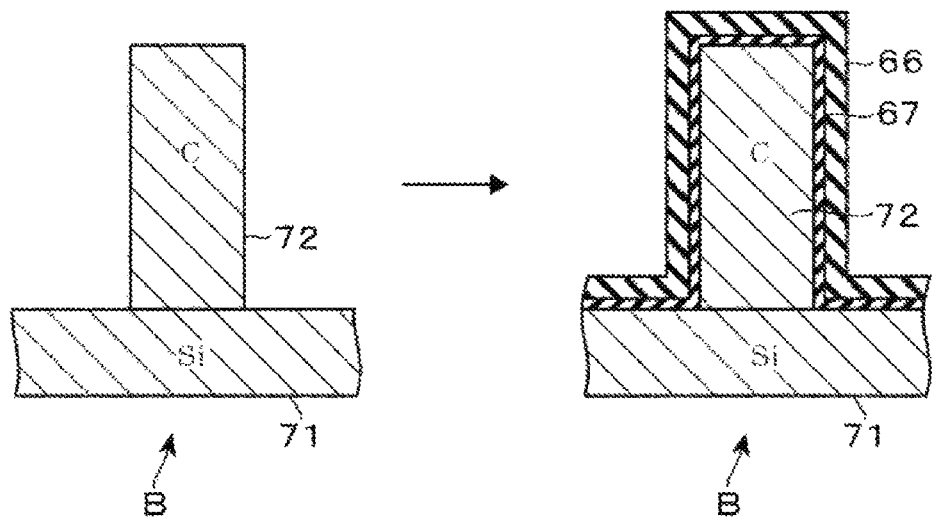
FIGS. 18 to 20 are longitudinal sectional views of the surface of a wafer which is processed according to the present disclosure.

By forming a seed layer and then forming a SiN film 66 by performing the processes according to the first to third embodiments with respect to the wafer B composed of the Si film 71 and the carbon film 72, it is possible to prevent a difference in incubation time of the SiN film 66 on the Si film 71 and the carbon film 72 and to suppress a variation in film thickness of the SiN film 66. In FIG. 18, an example in which a seed layer 67 composed of Si and the SiN film 66 are sequentially formed on the wafer B composed of the Si film 71 and the carbon film 72, as in the second embodiment, is shown.

Figure 19:
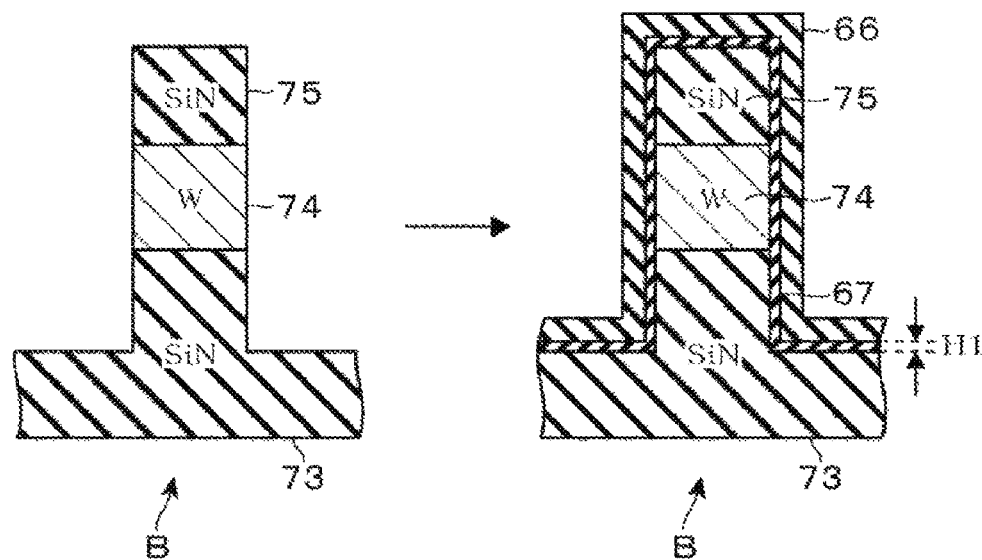

FIG. 19 illustrates a wafer B in which a surface of a SiN film 73 protrudes to form a protrusion, a W (tungsten) film 74 is stacked on the protrusion, and a SiN film 75 is stacked on the W film 74. The SiN film 73, the W film 74, and the SiN film 75 are exposed as the surface of the wafer B. Even in the wafer B configured as above, a seed layer followed by a SiN film may be formed on the wafer B, as described in the first to third embodiments.

Here, the W film 74 constitutes a conductive line of a semiconductor device manufactured from the wafer B. If a thickness H1 of the seed layer is too large, the characteristic of the conductive line may be degraded. Thus, the thickness (indicated by symbol H1) of the seed layer formed according to the respective embodiments may be 2 nm or less, specifically 1 nm or less. Nitridation of the surface of the conductive line may degrade the electrical characteristic of the conductive line. Thus, in a case where the wafer B in which the film constituting the conductive line is exposed, a seed layer may be formed as in the second and third embodiments. In an example shown in FIG. 19, the seed layer 67 composed of Si, which is described in the second embodiment, is formed and subsequently, a SiN film 66 is formed.

Figure 20:
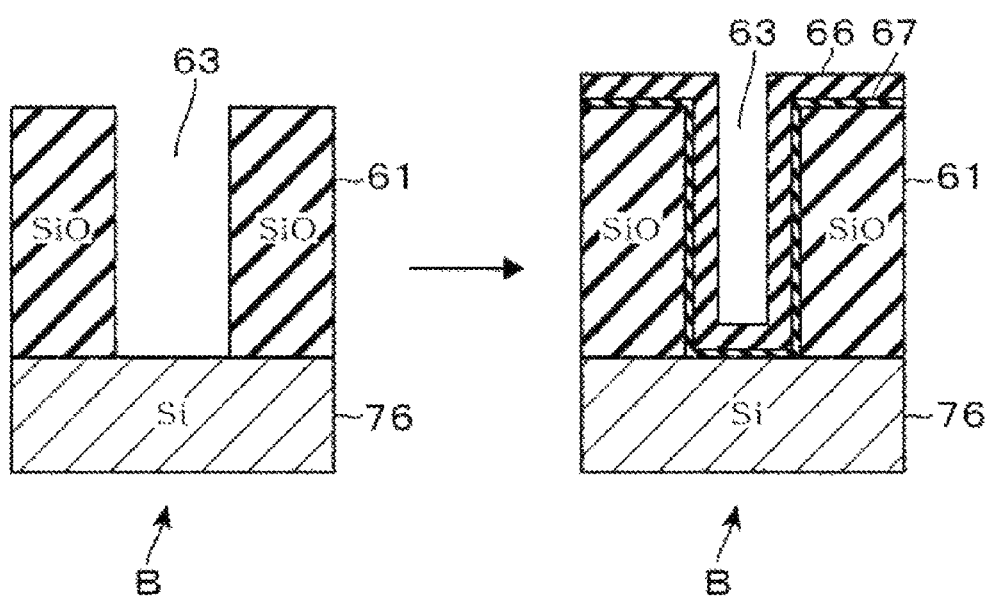

FIG. 20 illustrates a wafer B in which a SiO film 61 is formed on a Si film 76. The wafer B has a recess 63 formed therein. Side surfaces of the recess 63 are formed by the SiO film 61 and a bottom surface thereof is formed by the Si film 76. The SiO film 61 and the Si film 76 are configured as the surface of the wafer B. Even in the wafer B configured as above, as described in the first to third embodiments, a seed layer followed by a SiN film may be formed. In an example shown in FIG. 20, a seed layer 67 composed of Si is formed and subsequently, a SiN film 66 is formed, as in the second embodiment.

While the SiN film is formed by ALD in the above example, the present disclosure may also be applied to a case of forming a SiN film by a thermal CVD by simultaneously supplying a Si-containing raw material gas and an ammonia gas to a wafer B. Furthermore, in the case of forming the SiN film 66 by ALD, the wafer B may be maintained at a relatively low temperature of, for example, 150 degrees C. to 650 degrees C., and no microwaves may be supplied to the plasma generation regions R3 and R4 (namely, no plasma is generated) such that the supplied $NH_3$ gas is physically adsorbed onto the wafer B. Further, by not supplying the $NH_3$ gas and by supplying an $H_2$ gas to the plasma generation region R2, plasma may be generated in the plasma generation region R2.

In this case, a DCS gas is adsorbed in the raw material gas adsorption region R1, the $NH_3$ gas is physically adsorbed in the plasma generation regions R3 and R4 (no plasma is generated in the regions R3 and R4 as described above), and active species of the plasma act on the physically-adsorbed $NH_3$ gas in the plasma generation region R2 to allow the $NH_3$ gas and the DCS gas to react with each other to form the SiN film. For example, in a case where a carbon film prone to damage caused by plasma of an $NH_3$ gas is a base film, such a process may be effective. Furthermore, in a case where ALD is performed while heating the wafer B to the relatively low temperature already described in order to physically adsorb ammonia on the wafer B and no seed layer 64 is formed, a difference in incubation time between different base films becomes relatively larger. Accordingly, it is particularly effective to form the seed layer 64 described in the respective embodiments.

The SiN film may be formed by supplying an $NH_3$ gas from the plasma generation units 3A to 3C without generating plasma, and making silicon adsorbed onto the wafer B react with the $NH_3$ gas supplied from the units 3A to 3C by heat in the raw material gas adsorption region R1, while maintaining the wafer B at a temperature exceeding 650 degrees C. in the ALD process. That is to say, the formation of the SiN film is not limited to forming the SiN film by a plasma process. While the $H_2$ gas has been described to be used to generate the plasma in each process example, the present disclosure is not limited thereto. For example, an Ar gas may be used to generate the plasma. In addition, the aforementioned respective embodiments and the configuration examples of the films may be properly modified and combined with each other. For example, the film structures illustrated in FIGS. 18 to 20, which are configured with the carbon film, the Si film, and the W film, may be configured with the SiO film 61 and the SiN film 62.

Fourth Embodiment

In a fourth embodiment, as an example, a process is performed on a wafer B in which a SiO film 61 is stacked on the Si film 76 described with reference to FIG. 20, and a recess 63 is formed to expose the Si film 76 and the SiO film 61. An overview of the process in the fourth embodiment will be described. First, a nitride film is formed by nitriding the surfaces of the SiO film 61 and the Si film 76. A SiN film (for the sake of description, referred to as a lower SiN film) is formed on the nitride film under a process condition that a difference in incubation time between the Si film 76 and the SiO film 61 becomes relatively smaller. Thereafter, a SiN film (for the sake of description, referred to as an upper SiN film) having a better film quality than the lower SiN film is formed under a process condition that is different from that for the lower SiN film. A combination of the nitride film and the lower SiN film (a second silicon nitride film) constitutes a seed layer for suppressing a difference in incubation time of the upper SiN film (a first silicon nitride film) between the SiO film 61 and the Si film 76. The upper SiN film corresponds to the SiN film 66 described in the first embodiment.

A film forming apparatus 300 used in the fourth embodiment is configured such that a gas supply/exhaust unit 2, serving as a shower head, can alternately discharge a DCS gas and an Ar gas through gas discharge holes 21. Plasma generation units 3A to 3C are connected to an Ar gas supply source 29 rather than the $H_2$ gas supply source 43, and an Ar gas, instead of an $H_2$ gas, is discharged from first and second gas discharge holes 41 and 42. The film forming apparatus 300 of the fourth embodiment has the same configuration as that of the film forming apparatus 1 of the first embodiment, except for the differences described above.

Figure 21:
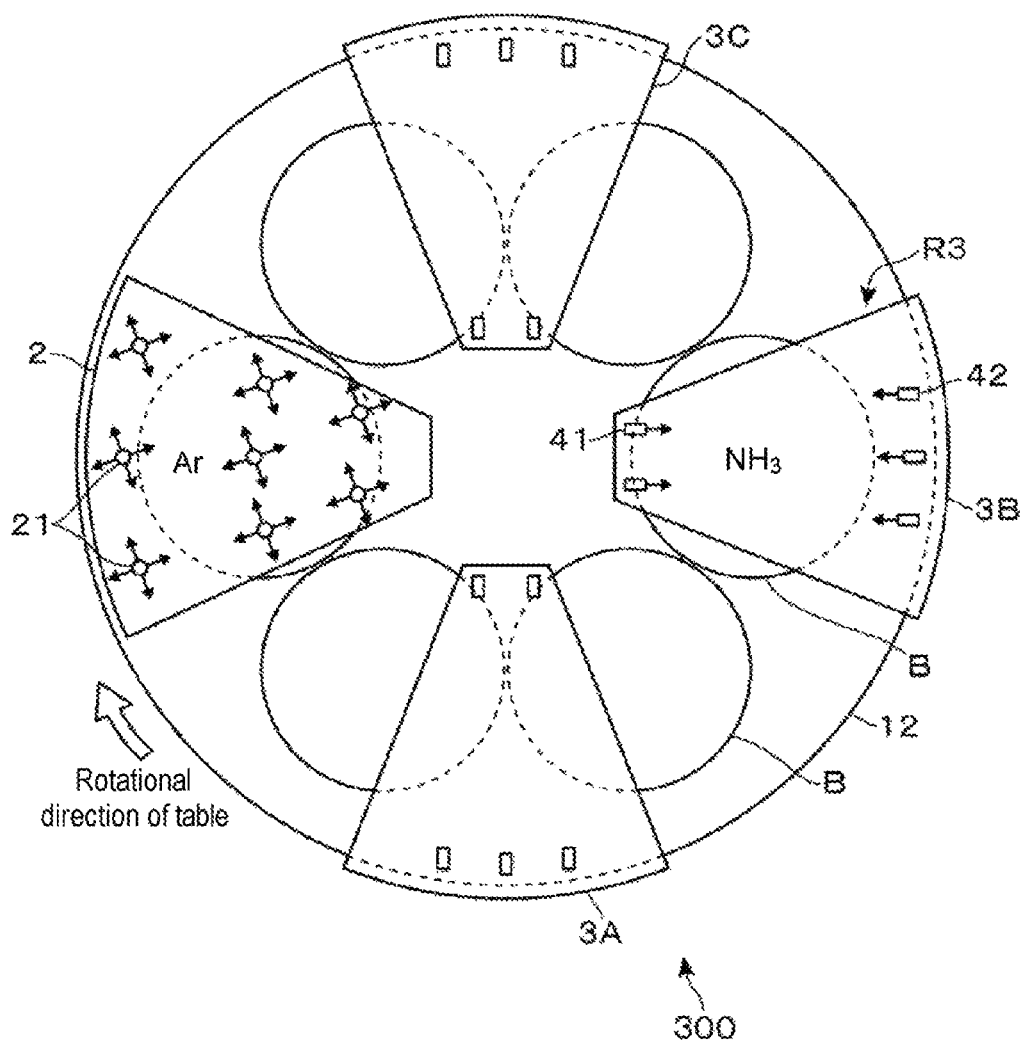
FIGS. 21 to 24 are schematic views of a film forming apparatus performing a process according to a fourth embodiment of the present disclosure.

The following description will be focused on a difference between the process in the fourth embodiment and the process in the first embodiment with reference to FIGS. 21 to 29. FIGS. 21 to 24 illustrate the operation of the film forming apparatus 300, and FIGS. 25 to 29 are longitudinal sectional views of a wafer B. First, the wafer B is carried into a vacuum container 11 and heated to a temperature of 150 degrees C. to 650 degrees C., for example, to 495 degrees C. at which an NH$_3$ gas can be physically adsorbed onto the wafer B in step S3, the interior of the vacuum container 11 is kept at a pressure of, for example, $1.2 \times 10^2$ Pa (0.9 Torr), and a rotary table 12 rotates. In the gas supply/exhaust unit 2, an Ar gas is discharged from the gas discharge holes 21 and a purge gas discharge opening 23 and exhausted through an exhaust opening 22. Meanwhile, the NH$_3$ gas is discharged from the gas discharge holes 41 and 42 of the plasma generation unit 3B as a base film nitriding gas supply part. However, the supply of microwaves to the NH$_3$ gas is not carried out (FIG. 21).

Figure 25:
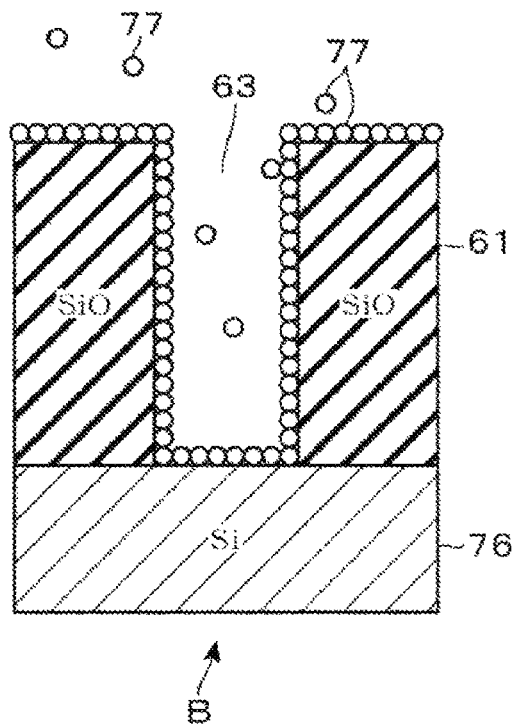
FIGS. 25 to 29 are longitudinal sectional views of a wafer which is being processed by the film forming apparatus.
Figure 26:
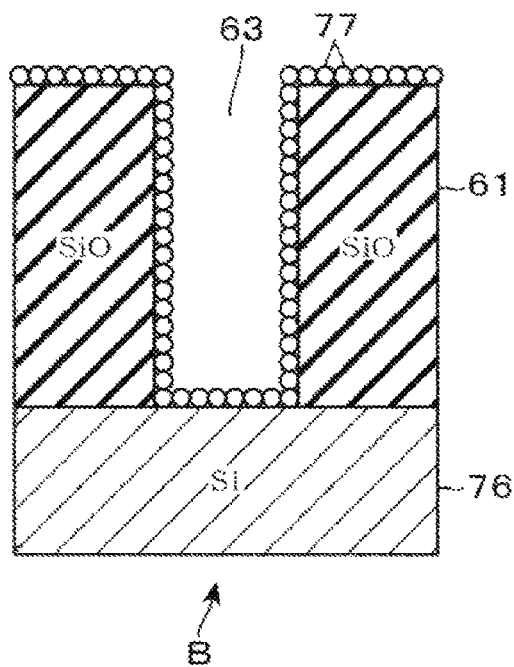

The NH$_3$ gas is adsorbed onto the surface of the wafer B when the wafer B passes beneath the plasma generation unit 3B. In FIG. 25, molecules of the NH$_3$ gas are indicated by reference numeral 77. When the wafer B passes beneath the gas supply/exhaust unit 2, the NH$_3$ gas not adsorbed onto the wafer B or detached from the wafer B, is purged from the surface of the wafer B by the Ar gas flowing on the surface of the wafer B (Step S1). FIG. 26 illustrates a state in which the purge process is carried out in this way.

Figure 22:
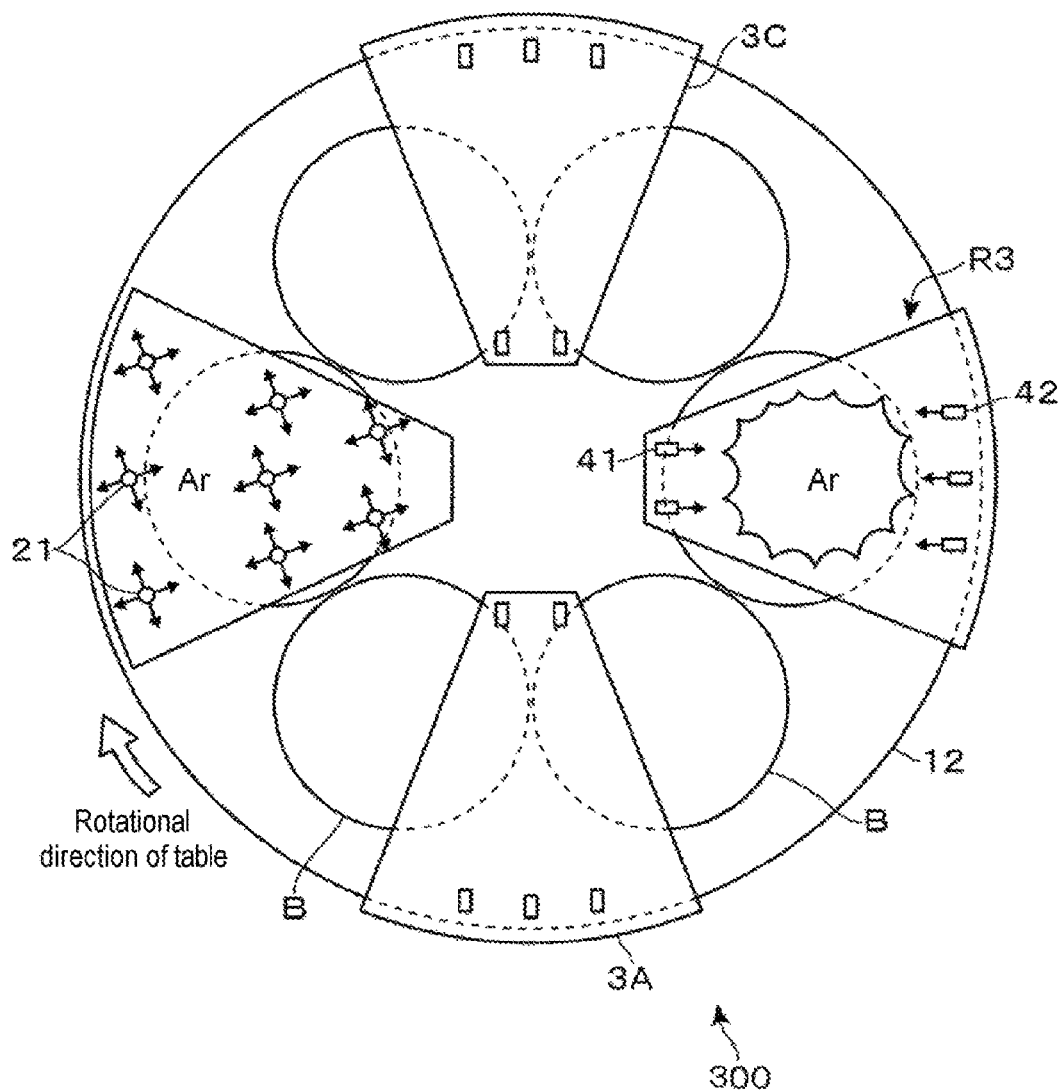
Figure 27:
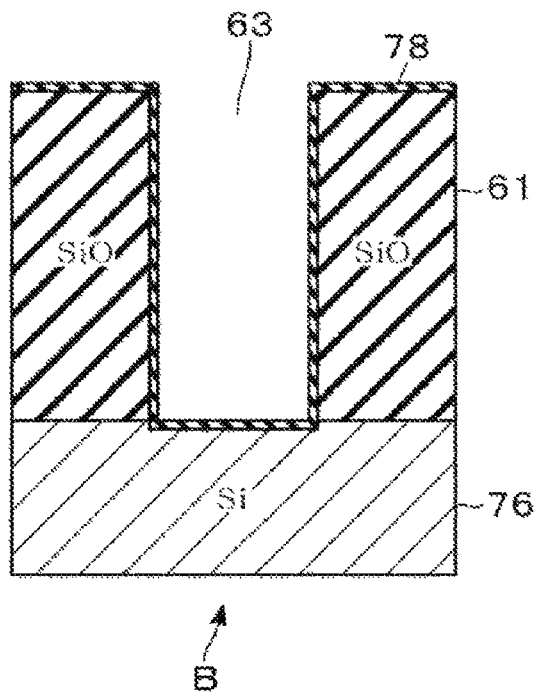

Subsequently, an Ar gas, instead of the NH$_3$ gas, is discharged from the gas discharge holes 41 and 42 of the plasma generation unit 3B used as a plasma generation part. Microwaves are supplied into a plasma generation region R3 to generate plasma of the Ar gas in the plasma generation region R3 (FIG. 22). The residual NH$_3$ gas below the gas supply/exhaust unit 2 is successively purged as in step S1. Meanwhile, the molecules 77 of the NH$_3$ gas adsorbed onto the wafer B are activated below the plasma generation region R3 by the plasma of the Ar gas so that active species such as radicals or the like are generated. SiO and Si constituting the surface of the recess 63 are nitrided by the species to form a nitride film 78, as illustrated in FIG. 27 (Step S2). The nitriding process includes substituting amino groups for the hydroxyl groups existing on the surfaces of the SiO film 61 and the Si film 76.

Figure 23:
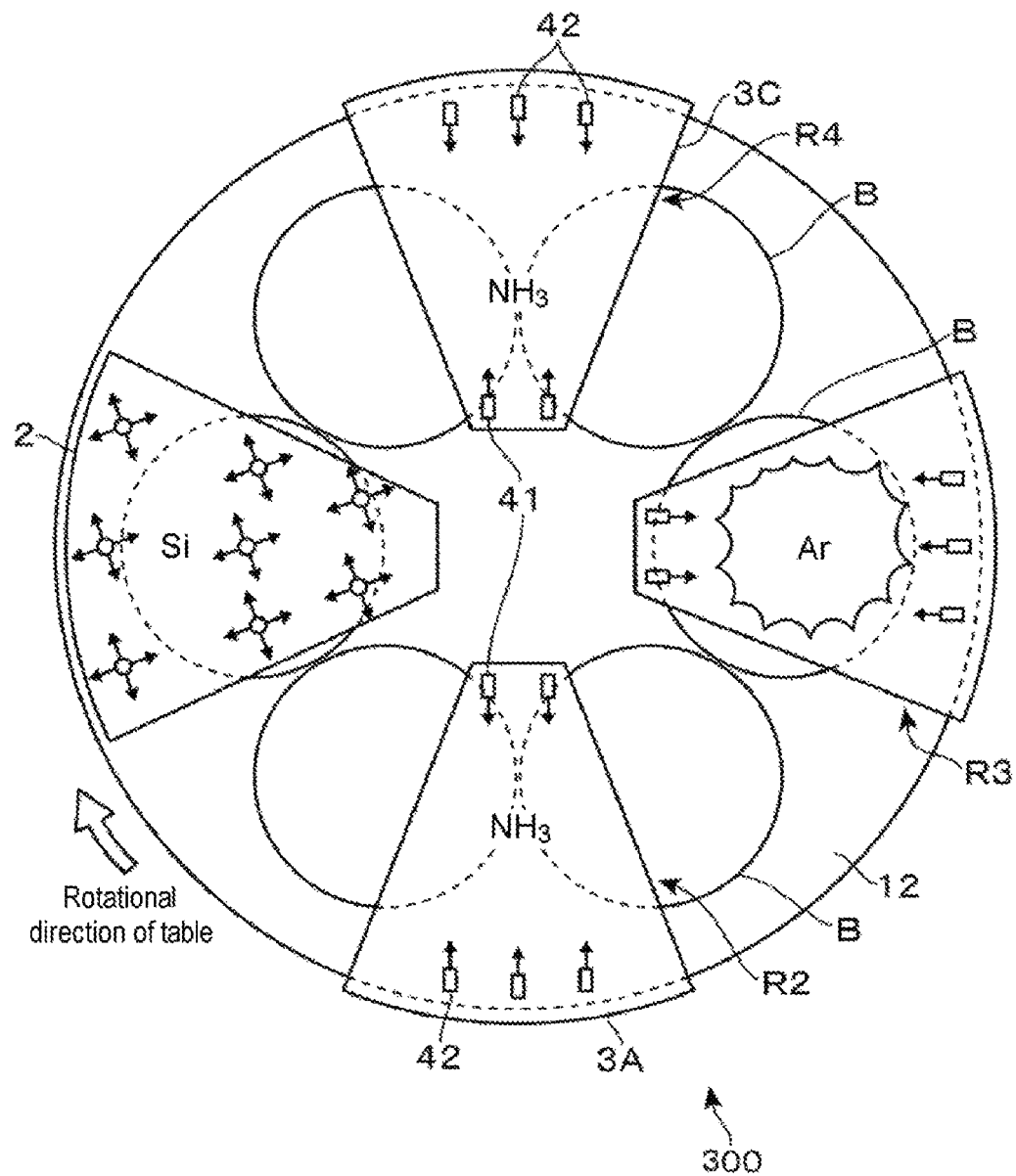
Figure 28:
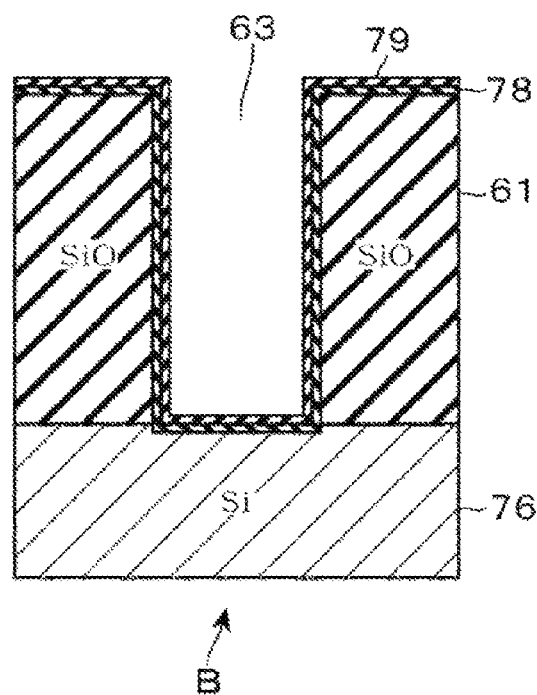

Thereafter, the internal pressure of the vacuum container 11 is increased to $6.67 \times 10^2$ Pa (5.0 Torr), and a DCS gas, instead of the Ar gas, is discharged from the gas discharge holes 21 of the gas supply/exhaust unit 2 used as a silicon raw material gas supply part. Meanwhile, an NH$_3$ gas is discharged from the gas discharge holes 41 and 42 of the plasma generation units 3A and 3C. The plasma of the Ar gas is successively generated in the plasma generation region R3 (FIG. 23). With the supply of the gases and the generation of the plasma, the DCS gas is first supplied and adsorbed onto the surface of the wafer B moving with the rotation of the rotary table 12, the NH$_3$ gas not plasmarized is subsequently supplied and physically adsorbed onto the surface of the wafer B, and subsequently, the NH$_3$ gas thus adsorbed is exposed to the plasma of the Ar gas and activated. The activated NH$_3$ gas generates active species such as radicals or the like and reacts with the DCS gas to form a thin SiN layer, which is stacked on the nitride film 78. As a series of processes are repeatedly performed on the wafer B with the rotation of the rotary table 12, the thin SiN layer is accumulated to form a lower SiN film 79 (FIG. 28, Step S3).

Figure 24:
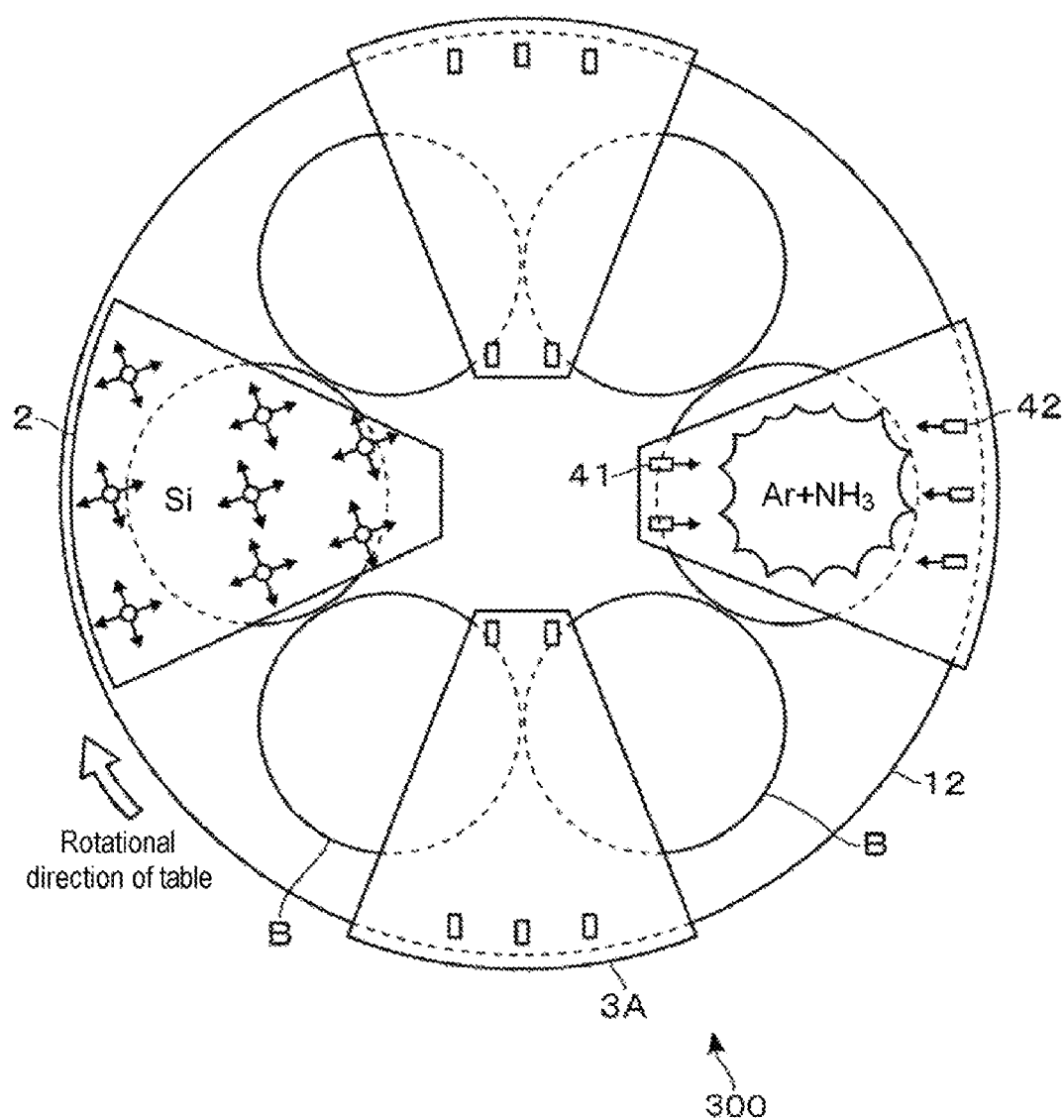

Thereafter, the discharge of the NH$_3$ gas from the gas discharge holes 41 and 42 of the plasma generation units 3A and 3C and the supply of the microwaves to the plasma generation regions R2 and R4 are stopped. The internal pressure of the vacuum container 11 is reduced to $2.13 \times 10^2$ Pa (1.6 Torr), and a mixture of the Ar gas and the NH$_3$ gas is discharged from the gas discharge holes 41 and 42 of the plasma generation unit 3B used as a nitriding gas supply part and a silicon nitride film forming part. Plasma of the mixture gas is generated by microwaves supplied to the plasma generation region R3 (FIG. 24).

Figure 29:
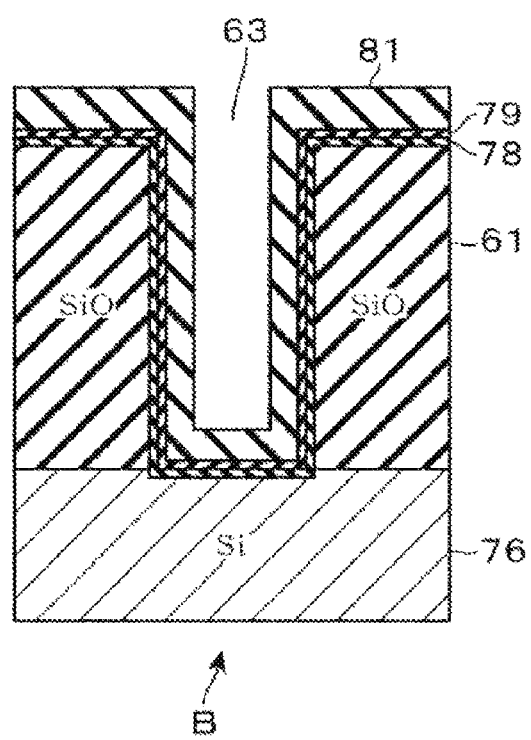

With the supply of the gases and the generation of the plasma, the molecules of the DCS gas are adsorbed onto the surface of the wafer B moving with the rotation of the rotary table 12, and the molecules thus adsorbed are nitrided by the plasma of the NH$_3$ gas and the Ar gas to form a thin SiN layer, which is stacked on the lower SiN film 79. As the adsorption and the nitridation are repeatedly performed on the wafer B with the rotation of the rotary table 12, the thin SiN layer is accumulated to form an upper SiN film 81 (FIG. 29, Step S4).

Upon the upper SiN film 81 which is formed to have a predetermined thickness, the supply of the gases and the generation of the plasma by the units 2 and 3A to 3C are stopped, and the film forming process is ended. According to the fourth embodiment, the upper SiN film 81 uniformly grows on the SiO film 61 and the Si film 76, by forming the nitride film 78 and the lower SiN film 79. Accordingly, it is possible to prevent a difference in film thickness of the upper SiN film 81, on the SiO film 61 and the Si film 76. Furthermore, the lower SiN film 79 has a lower resistance to etching than the upper SiN film 81 as illustrated in evaluation tests which will be described below. Thus, in order to form the upper SiN film 81 at a relatively thick thickness, the lower SiN film 79 is formed to have a film thickness of, for example, 20 Å or less.

In regard to the lower SiN film 79 formed in step S3, the reasons why a difference in incubation time of the lower SiN film 79 on the SiO film 61 and the Si film 76 is suppressed will be described below. One reason is that the active species of the NH$_3$ gas efficiently react with the DCS adsorbed onto the wafer B since the NH$_3$ gas is adsorbed onto the surface of the wafer B and then activated by exposure to the plasma in step S3. Another reason is that the molecules of the DCS gas are easily adsorbed onto the surface of the wafer B since the internal pressure of the vacuum container 11 in step S3 is set to be higher than that in step S4. Furthermore, since the plasma generation unit 3A also discharges the NH$_3$ gas in step S3, the wafer B exposed to the plasma of Ar is processed using the NH$_3$ gas supplied by the unit 3A before the DCS gas is supplied to the wafer B. However, the supply of the NH$_3$ gas by the unit 3A may not be carried out.

However, the nitride film 78 may be formed by a method similar to that described with reference to FIG. 6 in the first embodiment, instead of performing steps S1 and S2. Specifically, an NH$_3$ gas and an Ar gas are supplied to the plasma generation region R3 of the plasma generation unit 3B and are plasmarized by microwaves supplied to the plasma generation region R3. The wafer B is exposed to such a plasma to form a nitride film.

In steps S1 and S2, by activating the NH$_3$ gas adsorbed onto the wafer B, it is possible to efficiently nitride the SiO film 61 and the Si film 76, thus forming the nitride film 78. Furthermore, in steps S1 and S2, the residual NH$_3$ gas is removed from the wafer B by performing a purging process based on the Ar gas so that the adsorbed NH$_3$ gas is more certainly exposed to the plasma, thus more efficiently performing the nitriding process.

While in steps S1 and S2, the NH$_3$ gas has been described to be used to nitride the SiO film and the Si film as base films, the present disclosure is not limited thereto. For example, a $N_2$ (nitrogen) gas may be used. Furthermore, the upper SiN film 81 may be directly stacked on the nitride film 78 by performing steps S1 and S2 followed by step S4, without performing step S3 of forming the lower SiN film 79. That is to say, the seed layer may be configured with only the nitride film 78.

Further, the fourth embodiment may be properly modified, or may be combined with the aforementioned embodiments. For example, a process may be performed on various types of stack films illustrated in FIGS. 11, 18, and 19, but not the stack film configured with the SiO film 61 and the Si film 76. Further, steps S1 to S4 may be carried out using, for example, an $H_2$ gas instead of the Ar gas. Moreover, while in the above example, the DCS gas has been described to be supplied as a raw material gas of Si in steps S3 and S4, different types of raw material gases may be used in steps S3 and S4. For example, the aforementioned HCD gas may be used instead of the DCS gas in step S3 or S4. In addition, while the Ar gas has been described to be used as a plasma-generating gas in steps S3 and S4, another gas capable of generating plasma of, for example, the $H_2$ gas or the like, may be used. In the respective steps, different types of gases may be used as a plasma-generating gas, as in the case of the raw material gas of Si.

EVALUATION TESTS

Evaluation tests conducted in relation to the present disclosure will be described below.

Evaluation Test 1

Tests were conducted to identify the effect of the lower SiN film 79 in the fourth embodiment. In evaluation test 1-1, upper SiN films 81 were formed on lower SiN films 79 by performing steps S1 to S4 with respect to wafers B, respectively. A surface of each of the wafers B is composed of Si. A relationship between a film formation time period and a film thickness of each upper SiN film 81 was obtained by varying a time period during which step S4 is performed for each wafer B, namely a film formation time period during which the upper SiN film 81 is formed. Evaluation test 1-2 was conducted similar to evaluation test 1-1, except that wafers, each having a surface composed of SiO, were used.

In evaluation test 1-3, steps S1, S2, and S4 were performed with respect to wafers B, each having a surface composed of Si. That is to say, upper SiN films 81 were formed without any lower SiN film 79. A relationship between a film formation time period and a film thickness of each upper SiN film 81 was obtained by varying a time period during which the upper SiN film 81 is formed on each wafer B. Evaluation test 1-4 was conducted similar to evaluation test 1-3, except that wafers, each having a surface composed of SiO, were used.

Figure 30:
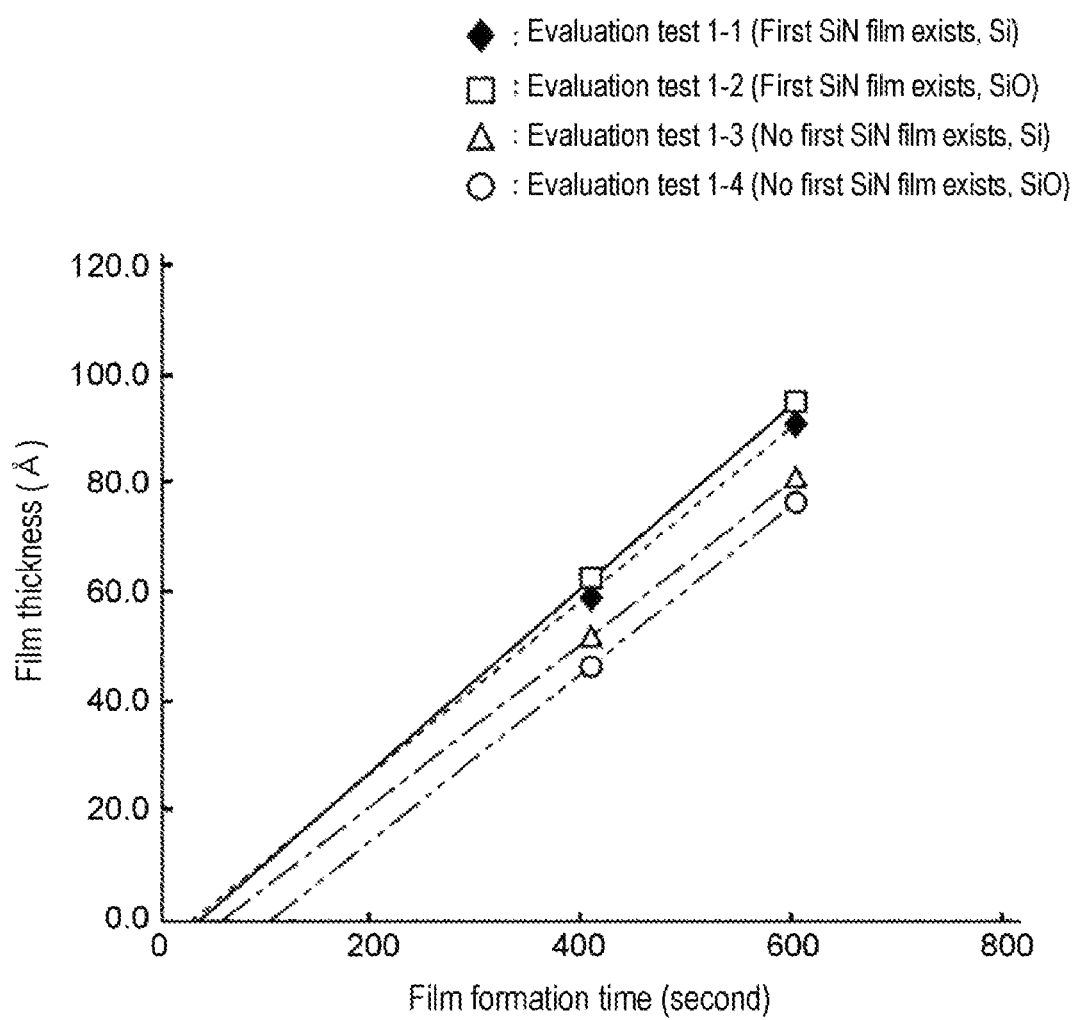
FIGS. 30 and 31 are graphs depicting the results of evaluation tests.

FIG. 30 is a graph depicting the results of evaluation tests 1-1 to 1-4. The horizontal axis of the graph represents the film formation time period (unit: second) of the upper SiN film 81, and the vertical axis of the graph represents the film thickness (unit: Å) of the upper SiN film 81. The measurement results of evaluation tests 1-1, 1-2, 1-3, and 1-4 are plotted with black quadrangles, white quadrangles, white triangles, and white circles, respectively. A line connecting plots in evaluation test 1-1 and the extension line thereof are shown by a dotted line, and a line connecting plots in evaluation test 1-2 and the extension line thereof are shown by a solid line. A line connecting plots in evaluation test 1-3 and the extension line thereof are shown by a dash-dot-dash line, and a line connecting plots in evaluation test 1-4 and the extension line thereof are shown by a dash-dot-dot line.

Figure 31:
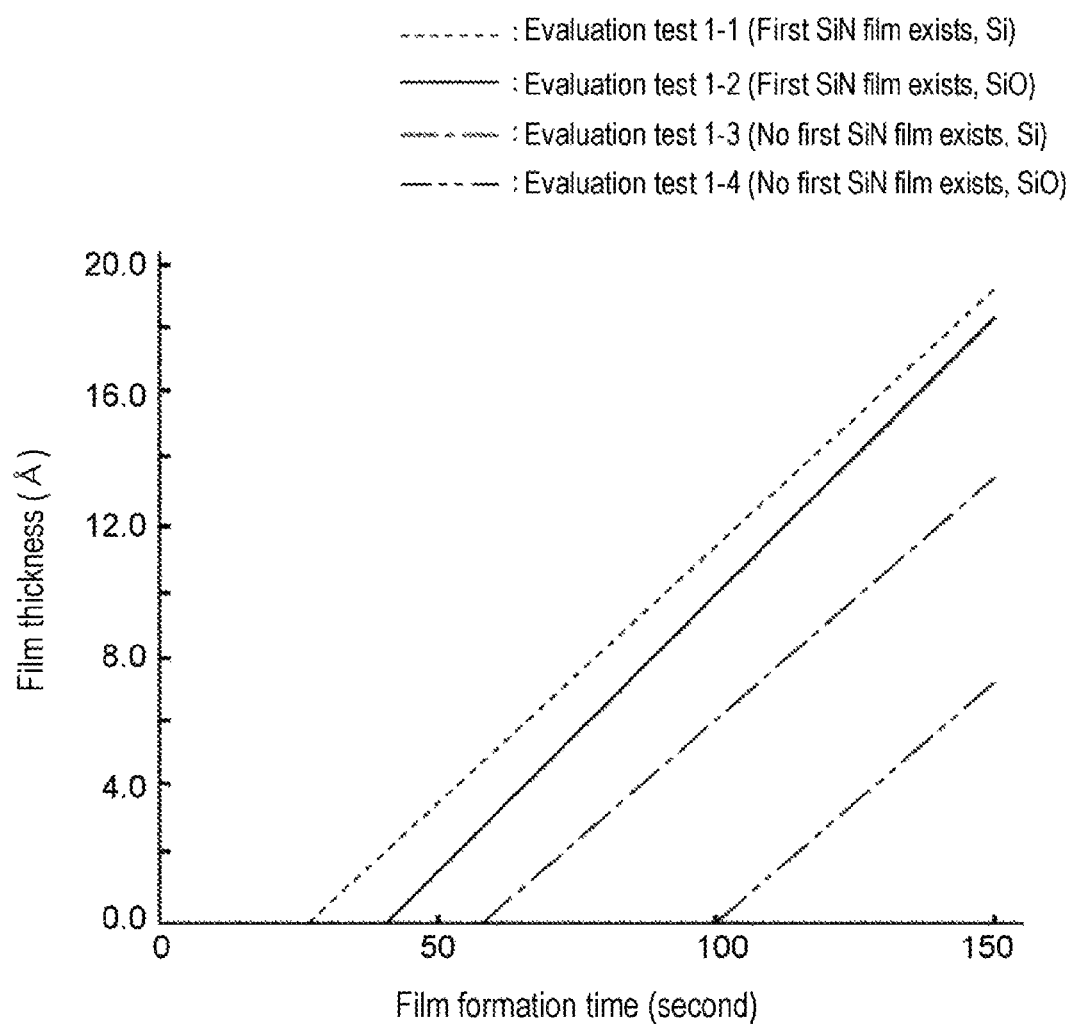
Figure 32:
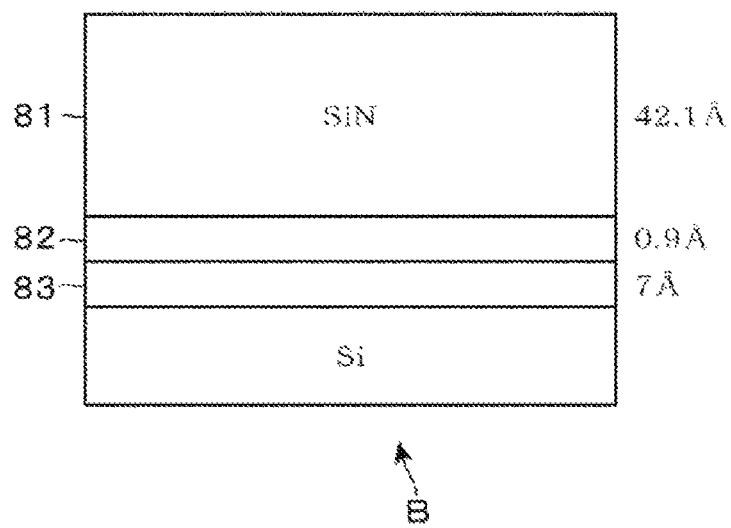
FIGS. 32 to 37 are longitudinal sectional views of a wafer, illustrating the results of evaluation tests.
Figure 33:
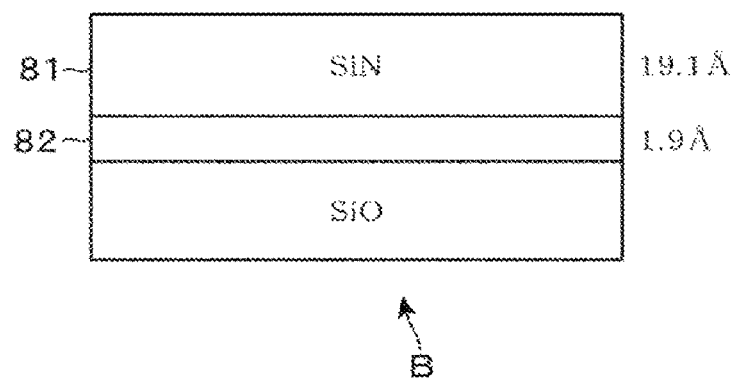
Figure 34:
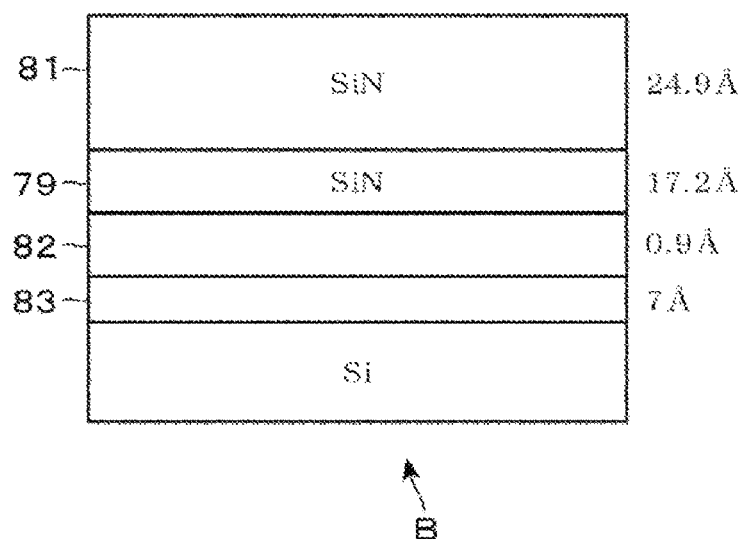
Figure 35:
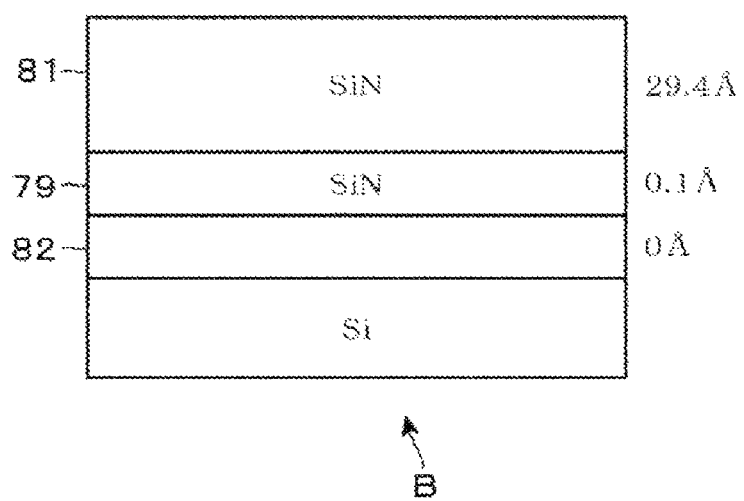
Figure 36:
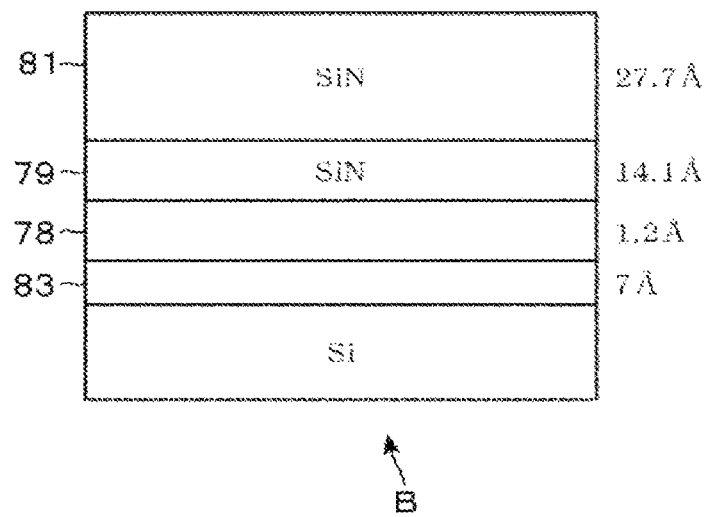
Figure 37:
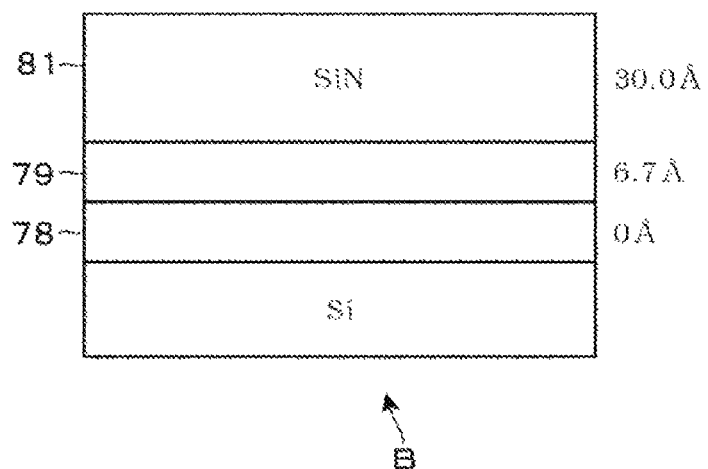

FIG. 31 is an enlarged graph of an area where a film formation time period ranges from 0 to 150 seconds in the graph of FIG. 30. The graph of FIG. 31 shows that when the film thickness is 0 Å, there is a difference in the film formation time period of 12.1 seconds between evaluation tests 1-1 and 1-2, and there is a difference in the film formation time period of 42.0 seconds between evaluation tests 1-3 and 1-4. A difference in the film thickness between evaluation tests 1-1 and 1-2 in which the lower SiN films 79 were formed is smaller than that between evaluation tests 1-3 and 1-4 in which no lower SiN film 79 was formed. Thus, it can be seen that the formation of the lower SiN films 79 makes the incubation time difference smaller.

Furthermore, a wet-etching process was performed with respect to the lower SiN films 79 and the upper SiN films 81 formed in evaluation test 1, using a mixture of a hydrofluoric acid and pure water for a time period of 60 seconds, to measure etching rates. A ratio of the hydrofluoric acid to the pure water in the mixture was 1 (ml):100 (ml). The etching rate of the lower SiN films 79 was 24.6 Å/min, and the etching rate of the upper SiN films 81 was 3.6 Å/min. Since the SiN film is occasionally used as a mask for etching a lower film as already described, a low etching rate is preferable. Accordingly, it is preferable that the lower SiN films 79 have a relatively small film thickness in the range in which the incubation time difference can be suppressed, as described in the fourth embodiment.

Evaluation Test 2

In evaluation test 2-1, a nitride film 82 was formed by supplying an $NH_3$ gas to a wafer B composed of Si and removing a hydroxyl group remaining on the surface of the wafer B. However, the $NH_3$ gas was not plasmarized. After the nitride film 82 was formed, an upper SiN film 81 was formed by performing step S4 of the fourth embodiment, and a film thickness of each film was measured. Evaluation test 2-2 was conducted similar to evaluation test 2-1, except that a wafer B composed of SiO was used.

In evaluation test 2-3, a nitride film 82 was formed by supplying an $NH_3$ gas to a wafer B composed of Si as in evaluation test 2-1, and subsequently, a lower SiN film 79 and an upper SiN film 81 were formed by performing steps S3 and S4 of the fourth embodiment. Then, a film thickness of each film was measured. Evaluation test 2-4 was conducted similar to evaluation test 2-3, except that a wafer B composed of SiO was used. In evaluation test 2-5, a nitride film 78, a lower SiN film 79, and an upper SiN film 81 were formed by performing steps S1 to S4 of the fourth embodiment with respect to a wafer B composed of Si, and a film thickness of each film was measured. Evaluation test 2-6 was conducted similar to evaluation test 2-5, except that a wafer B composed of SiO was used.

FIGS. 32 to 37 are longitudinal sectional views of the wafers B processed in evaluation tests 2-1 to 2-6, where film thicknesses of respective films are indicated at right sides of the respective films. In evaluation test 2-1, the film thickness of a natural oxide film 83 having a surface composed of Si was 7 Å, the film thickness of the nitride film 82 was 0.9 Å, and the film thickness of the upper SiN film 81 was 42.1 Å. In evaluation test 2-2, the film thickness of the nitride film 82 was 1.9 Å, and the film thickness of the upper SiN film 81 was 19.1 Å. In evaluation test 2-3, the film thickness of a natural oxide film 83 was 7 Å, the film thickness of the nitride film 82 was 0.9 Å, the film thickness of the lower SiN film 79 was 17.2 Å, and the film thickness of the upper SiN film 81 was 24.9 Å. In evaluation test 2-4, the film thickness of the nitride film 82 was 0 Å, the film thickness of the lower SiN film 79 was 0.1 Å, and the film thickness of the upper SiN film 81 was 29.4 Å. In evaluation test 2-5, the film thickness of a natural oxide film 83 was 7 Å, the film thickness of the nitride film 78 was 1.2 Å, the film thickness of the lower SiN film 79 was 14.1 Å, and the film thickness of the upper SiN film 81 was 27.7 Å. In evaluation test 2-6, the film thickness of the nitride film 78 was 0 Å, the film thickness of the lower SiN film 79 was 6.7 Å, and the film thickness of the upper SiN film 81 was 30.0 Å.

A difference in the film thickness between the upper SiN films 81 in evaluation tests 2-1 and 2-2 was at a high level of 23 Å, whereas a difference in the film thickness between the upper SiN films 81 in evaluation tests 2-3 and 2-4 was at a level of 4.5 Å, and a difference in the film thickness between the upper SiN films 81 in evaluation tests 2-5 and 2-6 was at a level of 2.2 Å. Evaluation test 2 shows that the difference in the film thickness between the upper SiN films 81, which is caused by different materials of the respective base films, can be suppressed by forming a seed layer. That is to say, the effects of the present disclosure have been identified. Furthermore, it is confirmed that, by forming the SiN film 79 by step S3 of the fourth embodiment, it is possible to suppress the film thickness difference between the upper SiN films 81. Further, it is confirmed that, by forming the nitride films 78 by steps S1 and S2, it is possible to further suppress the film thickness difference between the upper SiN films 81.

According to the present disclosure, a seed layer is formed on exposed surfaces of first and second base films, which constitute a stepped portion, and a silicon nitride film is stacked on the seed layer. By the seed layer, the silicon nitride film uniformly grows on the surface of the first base film and the surface of the second base film, which makes it possible to enhance a film thickness uniformity of the silicon nitride film on the entire surface of the first and second base films.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a silicon nitride film to cover a stepped portion formed in a substrate, the stepped portion being formed by exposed surfaces of different types of first and second base films which are stacked one above another, the method comprising:
    forming a seed layer to cover the stepped portion, wherein the seed layer is composed of a silicon-containing film formed by supplying a raw material gas of silicon to the substrate and is configured such that the silicon nitride film uniformly grows on the surface of the first base film and on the surface of the second base film; and
    subsequently, forming the silicon nitride film on the seed layer by supplying, to the substrate, the raw material gas of silicon and a silicon-nitriding gas for nitriding
    wherein the forming the seed layer is performed in a state where an internal pressure of a vacuum container in which the substrate is received is set to be higher than that used when forming the silicon nitride film.

2. The method of claim 1, wherein the stepped portion is a recess having an aspect ratio of 3 or more.

3. The method of claim 1, wherein the seed layer has a thickness of 2 nm or less.

* * * * *